(12) United States Patent
Terai

(10) Patent No.: US 10,305,032 B2
(45) Date of Patent: May 28, 2019

(54) MEMORY DEVICE AND METHOD OF FABRICATING THE SAME

(71) Applicant: SAMSUNG ELECTRONICS CO., LTD., Suwon-si, Gyeonggi-do (KR)

(72) Inventor: Masayuki Terai, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/663,065

(22) Filed: Jul. 28, 2017

(65) Prior Publication Data

US 2018/0151623 A1 May 31, 2018

(30) Foreign Application Priority Data

Nov. 30, 2016 (KR) .................. 10-2016-0162303

(51) Int. Cl.
*H01L 45/00* (2006.01)
*H01L 21/02* (2006.01)
(Continued)

(52) U.S. Cl.
CPC ............ *H01L 45/124* (2013.01); *C23C 16/34* (2013.01); *H01L 21/02414* (2013.01); *H01L 21/02417* (2013.01); *H01L 21/02483* (2013.01); *H01L 27/2409* (2013.01); *H01L 27/2472* (2013.01); *H01L 45/122* (2013.01); *H01L 45/126* (2013.01); *H01L 45/1233* (2013.01); *H01L 45/1253* (2013.01); *H01L 45/16* (2013.01); *H01L 45/1666* (2013.01); *H01L 45/1675* (2013.01); *H01L 45/1691* (2013.01);
(Continued)

(58) Field of Classification Search
CPC . H01L 45/122; H01L 45/1233; H01L 45/124; H01L 45/1253; H01L 45/126; H01L 45/128; H01L 45/1286; H01L 45/16; H01L 45/1666; H01L 45/1675; H01L 45/1683; H01L 45/1691; H01L 27/2463; H01L 27/2481; H01L 21/02417; H01L 21/02414; H01L 21/02483; H01L 21/02485
See application file for complete search history.

(56) References Cited

U.S. PATENT DOCUMENTS 8,030,128 B1  10/2011  Sutardja et al.
8,030,734 B2  10/2011  Dennison et al.
(Continued)

*Primary Examiner* — Eduardo A Rodela
(74) *Attorney, Agent, or Firm* — Volentine, Whitt & Francos, PLLC

(57) ABSTRACT

A memory cell pillar of a memory device includes a heating electrode having a base portion (leg) and a fin portion (ascender), and a selection device between a first conductive line and the heating electrode. A side surface of the selection device and a side surface of the fin portion extend along a first straight line. A method of fabricating a memory device includes forming a plurality of first insulating walls through a stack structure including a preliminary selection device layer and a preliminary electrode layer, forming a plurality of self-aligned preliminary heating electrode layers, forming a plurality of second insulating walls each between two of the plurality of first insulating walls, and forming a plurality of third insulating walls in a plurality of holes extending along a direction intersecting the plurality of first insulating walls.

19 Claims, 34 Drawing Sheets

(51) Int. Cl.
*C23C 16/34* (2006.01)
*H01L 27/24* (2006.01)

(52) U.S. Cl.
CPC ........ *H01L 27/2427* (2013.01); *H01L 45/144* (2013.01); *H01L 45/1683* (2013.01)

(56) References Cited

U.S. PATENT DOCUMENTS

| | | |
|---|---|---|
| 8,426,840 B2 | 4/2013 | An et al. |
| 8,501,523 B2 | 8/2013 | Lee et al. |
| 8,987,700 B2 | 3/2015 | Lai et al. |
| 9,331,272 B2 * | 5/2016 | Hwang .................. H01L 45/06 |
| 9,741,764 B1 * | 8/2017 | Terai .................. H01L 27/2427 |
| 2009/0196091 A1 | 8/2009 | Kau et al. |
| 2010/0327251 A1 * | 12/2010 | Park .................. H01L 27/2409 257/2 |
| 2011/0266516 A1 * | 11/2011 | Park .................. H01L 27/2409 257/5 |
| 2016/0260776 A1 | 9/2016 | Lee et al. |
| 2017/0117328 A1 * | 4/2017 | Terai .................. H01L 27/2481 |
| 2017/0294483 A1 * | 10/2017 | Terai .................. H01L 27/2427 |

\* cited by examiner

MEMORY DEVICE AND METHOD OF FABRICATING THE SAME

PRIORITY STATEMENT

This application claims the benefit of Korean Patent Application No. 10-2016-0162303, filed on Nov. 30, 2016, in the Korean Intellectual Property Office, the disclosure of which is hereby incorporated by reference in its entirety.

BACKGROUND

The inventive concept relates to a memory device and to a method of fabricating the same. More particularly, the inventive concept relates to a memory device having a cross-point array structure and to a method of fabricating the same.

A next-generation integrated non-volatile memory device that has been proposed is a 3-dimensional cross-point stack-structured memory device in which a memory cell is arranged at a cross-point between two electrodes crossing each other. Furthermore, with the trend of lighter, thinner, and smaller electronics, there is increasing demand in the semiconductor device industry for more highly integrated semiconductor devices. Accordingly, there are continuous requirements to increase the integration and scale down cross-point stack-structured memory devices. However, reducing the sizes of components constituting a memory device, such as a 3-dimensional cross-point stack-structured memory device, imposes challenges in maintaining the reliability required for the memory device.

SUMMARY

According to an aspect of the inventive concept, there is provided a memory device including: a first conductive line extending over a substrate in a first direction; a second conductive line extending over the first conductive line in a second direction that intersects the first direction; a memory cell pillar between the first conductive line and the second conductive line; and an insulating wall over the substrate, the insulating wall facing a side surface of the memory cell pillar, wherein the memory cell pillar includes: a heating electrode layer, which has an L-shaped cross-section and includes a base portion extending parallel to the first conductive line and a fin portion extending from an end of the base portion in a direction away from the first conductive line; and a selection device layer between the first conductive line and the heating electrode layer, and a side surface of the selection device layer, which faces the insulating wall, and a side surface of the fin portion, which faces the insulating wall, extend along a first straight line.

According to another aspect of the inventive concept, there is provided a method of fabricating a memory device, the method including: forming a stack structure over a substrate, the stack structure comprising a preliminary selection device layer and a preliminary electrode layer; forming a plurality of first line spaces extending through the stack structure; forming a plurality of first insulating walls in the plurality of first line spaces, the plurality of first insulating walls including protrusions each protruding upwards from the stack structure; forming a plurality of preliminary heating electrode layers, which cover side surfaces of the protrusions of the plurality of first insulating walls; forming a plurality of second line spaces, each of the plurality of second line spaces being situated between two of the plurality of the first insulating walls, and the plurality of second line spaces extending through the stack structure; forming a plurality of second insulating walls in the plurality of second line spaces, the plurality of second insulating walls extending parallel to the plurality of first insulating walls; forming a plurality of holes by removing portions of the plurality of preliminary heating electrode layers and the stack structure which extend along a direction intersecting the plurality of first insulating walls, the holes exposing portions of the preliminary selection device layer and thereby forming a plurality of selection device layers, and the holes exposing portions of the preliminary electrode layer and thereby forming a plurality of electrode layers; and forming a plurality of third insulating walls in the plurality of holes, the plurality of third insulating walls covering side surfaces of the plurality of selection device layers and side surfaces of the plurality of electrode layers.

According to a further aspect of the inventive concept, there is provided a method of fabricating a memory device, the method including: forming a preliminary bottom electrode layer, a preliminary selection device layer, and a preliminary intermediate electrode layer on a substrate one over another in this stated order; forming a plurality of first line spaces, which extend through the preliminary intermediate electrode layer, the preliminary selection device layer, and the preliminary bottom electrode layer; forming a plurality of first insulating walls in the plurality of first line spaces, the plurality of first insulating walls including protrusions each protruding upwards from the preliminary intermediate electrode layer; forming a plurality of preliminary heating electrode layers and a plurality of preliminary first insulating spacers on the preliminary intermediate electrode layer, the plurality of preliminary heating electrode layers and the plurality of preliminary first insulating spacers covering side surfaces of the plurality of first insulating walls; forming a plurality of second line spaces each between two of the plurality of first insulating walls, the plurality of second line spaces extending through the preliminary intermediate electrode layer, the preliminary selection device layer, and the preliminary bottom electrode layer; forming a plurality of second insulating walls in the plurality of second line spaces, the plurality of second insulating walls extending parallel to the plurality of first insulating walls; forming a plurality of holes by partially removing portions of the plurality of preliminary heating electrode layers, the plurality of preliminary first insulating spacers, the preliminary intermediate electrode layer, the preliminary selection device layer, and the preliminary bottom electrode layer which extend along a direction intersecting the plurality of first insulating walls; and forming a plurality of third insulating walls in the plurality of holes.

According to a further aspect of the inventive concept, there is provided a method of fabricating a memory device, the method including: forming a set of parallel first conductive lines on a substrate, each of the first conductive lines extending lengthwise in a first direction parallel to an upper surface of the substrate; forming an array of memory cell pillars, each of the memory cell pillars extending upright on a respective one of the first conductive lines in a direction perpendicular to the upper surface of the substrate; and forming a set of parallel second conductive lines, each of the second conductive lines extending lengthwise in a second direction parallel to the upper surface of the substrate and crossing over a plurality of the first conductive lines and each of the memory cell pillars extending upright on the plurality of first conductive lines, such that the memory cell pillars are located at points at which the second conductive lines and the first conductive lines cross as seen in a plan view of the conductive lines and memory cell pillars. The forming of the array of memory cell pillars forms resistive memory elements each having a state of resistance that can be changed and that stores information corresponding to the state of resistance, selection devices that serve to allow the memory elements to be selectively accessed, heating electrodes each having an L-shaped cross section in a vertical plane so as to each have a leg and an ascender, and first insulating spacers each disposed on the leg of a respective one of the heating electrodes. The forming of the array of memory cell pillars includes forming the heating electrodes as self-aligned with opposite sides of the pillars, and forming the resistive memory elements each directly on both the ascender of a respective one of the heating electrodes and a respective one of the first insulating layer spacers.

BRIEF DESCRIPTION OF THE DRAWINGS

The inventive concept will be more clearly understood from the following detailed description of examples thereof taken in conjunction with the accompanying drawings in which.

DETAILED DESCRIPTION

Figure 1:
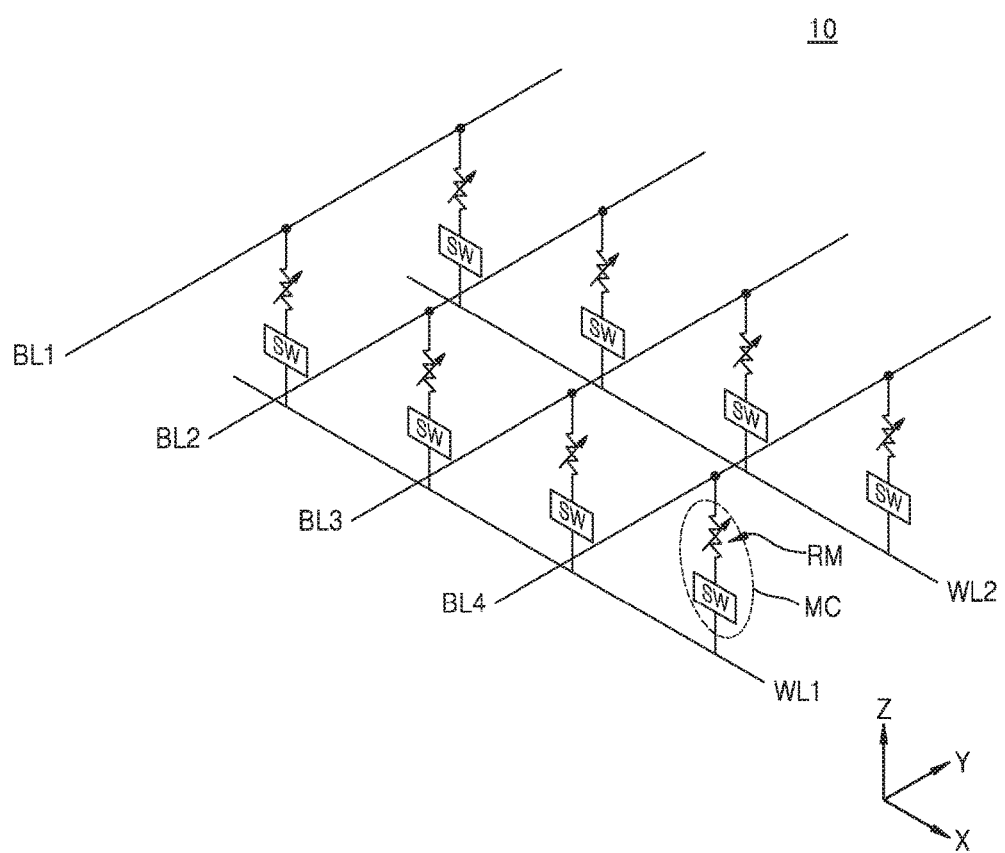
FIG. 1 is an equivalent circuit diagram of an example of a memory device according to the inventive concept.

Hereinafter, the inventive concept will be described in detail with reference to the accompanying drawings. Like components will be denoted by like reference numerals throughout the specification, and repeated descriptions thereof will be omitted.

FIG. 1 is an equivalent circuit diagram of an example of a memory device 10 according to the inventive concept.

Referring to FIG. 1, the memory device 10 includes word lines WL1 and WL2, which extend along a first direction (X direction) and are separated in a second direction (Y direction) that is perpendicular to the first direction, and bit lines BL1, BL2, BL3, and BL4, which are separated from the word lines WL1 and WL2 in a third direction (Z direction) and extend along the second direction.

The memory device 10 includes a plurality of memory cells MC, which are respectively arranged at intersection points (in a plan view of the device) between the word lines WL1 and WL2 and the bit lines BL1, BL2, BL3, and BL4. Each of the plurality of memory cells MC may include a resistive memory layer RM for storing information and a selection device layer SW for selecting a memory cell.

For each of the plurality of memory cells MC, the selection device layer SW may be electrically connected to one of the word lines WL1 and WL2, the resistive memory layer RM may be electrically connected to one of the bit lines BL1, BL2, BL3, and BL4, and the resistive memory layer RM and the selection device layer SW may be connected to each other in series. However, the inventive concept is not limited thereto; rather, the resistive memory layer RM may be connected to a word line, and the selection device layer SW may be connected to a bit line.

To drive the memory device, voltage may be applied to the resistive memory layer RM of each memory cell MC through the word lines WL1 and WL2 and the bit lines BL1, BL2, BL3, and BL4, whereby current may flow through the resistive memory layer RM. An arbitrary memory cell MC may be addressed by performing selection from the word lines WL1 and WL2 and the bit lines BL1, BL2, BL3, and BL4, and the memory cell MC may be programmed by applying a certain signal between the word lines WL1 and WL2 and the bit lines BL1, BL2, BL3, and BL4. In addition, a value of current may be measured through the bit lines BL1, BL2, BL3, and BL4, whereby information corresponding to a value of resistance of the resistive memory layer RM of the corresponding memory cell MC, that is, programmed information, may be read.

Figure 2:
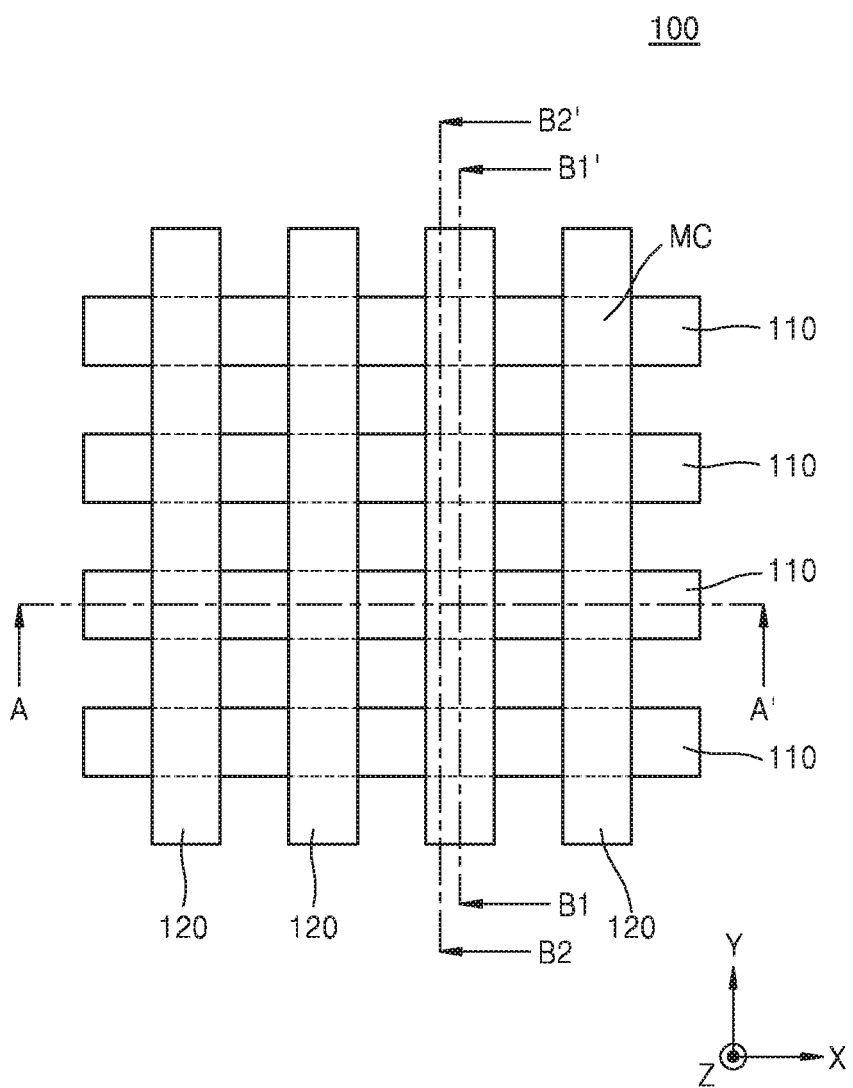
FIG. 2 is a schematic planar layout diagram illustrating main components of an example of a memory device according to the inventive concept.
Figure 3A:
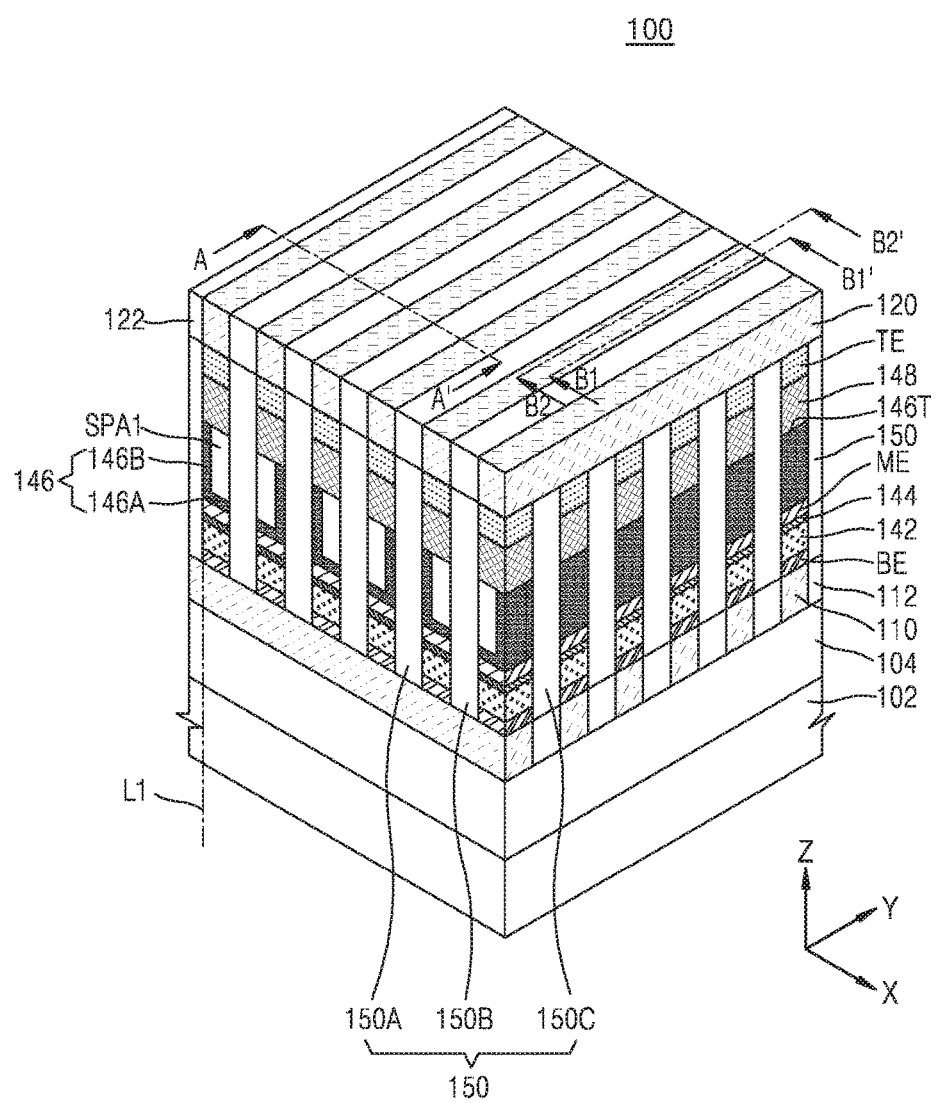
FIG. 3A is a perspective view illustrating main components of an example of a memory device according to the inventive concept.
Figure 3B:
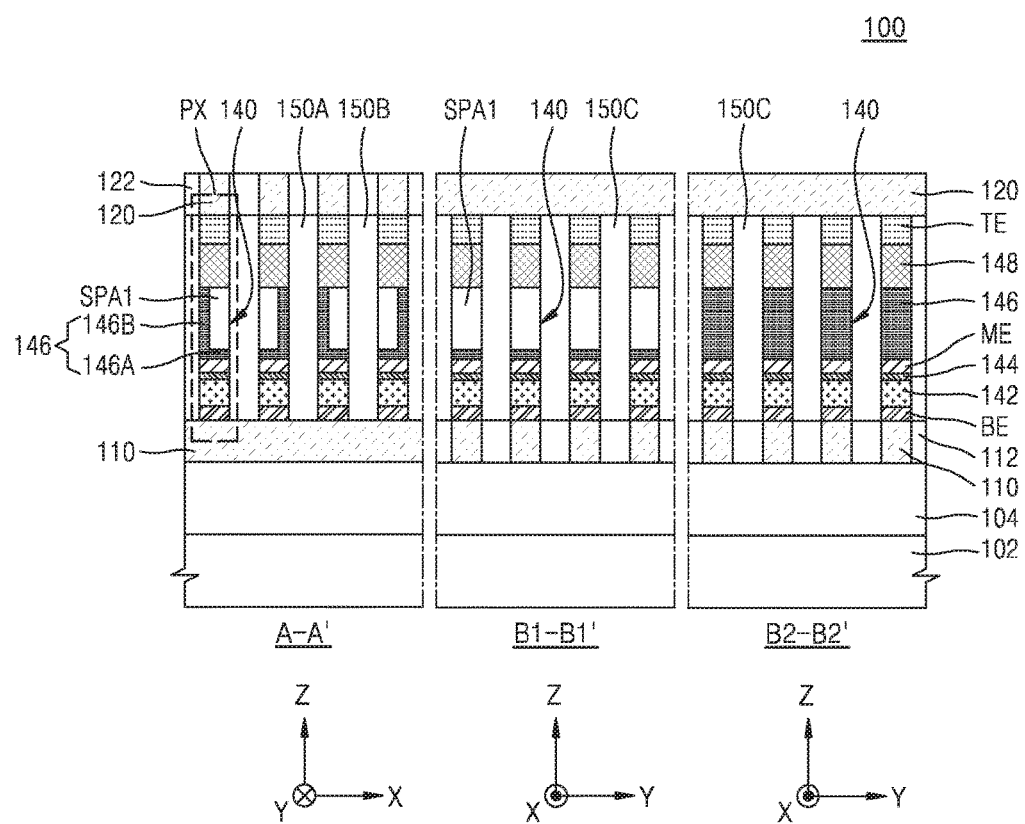
FIG. 3B illustrates cross-sectional views of the main components, respectively taken along lines A-A', B1-B1', and B2-B2' of FIG. 3A.

FIGS. 2 to 3B are diagrams illustrating an example of a memory device according to the inventive concept, and in particular, FIG. 2 is a schematic planar layout diagram illustrating main components of a memory device 100, FIG. 3A is a perspective view illustrating the main components of the memory device 100, and FIG. 3B illustrates cross-sectional views of the main components, respectively taken along lines A-A', B1-B1', and B2-B2' of FIG. 3A. The memory device 100 shown in FIGS. 2 to 3B may have the same equivalent circuit configuration as the memory device 10 shown in FIG. 1.

Referring to FIGS. 2 to 3B, the memory device 100 includes a plurality of first conductive lines 110 extending parallel to each other over a substrate 102 in a first direction (X direction), and a plurality of second conductive lines 120 extending parallel to each other in a second direction (Y direction) that intersects the first direction. Although the figures illustrate an example in which the first direction corresponds to an X direction, the second direction corresponds to a Y direction, and the first direction and the second direction are orthogonal to each other, the inventive concept is not limited thereto. Rather, in other examples the first direction and the second direction intersect and are oblique.

The plurality of first conductive lines 110 may constitute the plurality of word lines WL1 and WL2 shown in FIG. 1, and the plurality of second conductive lines 120 may constitute the bit lines BL1, BL2, BL3, and BL4. First insulating patterns 112 may be interposed between the first conductive lines 110, and second insulating patterns 122 may be interposed between the second conductive lines 120.

Each of the plurality of first conductive lines 110 and the plurality of second conductive lines 120 may include a metal, a conductive metal nitride, a conductive metal oxide, or combinations thereof. In examples of the inventive concept, each of the plurality of first conductive lines 110 and the plurality of second conductive lines 120 may include W, WN, Au, Ag, Cu, Al, TiAlN, Ir, Pt, Pd, Ru, Zr, Rh, Ni, Co, Cr, Sn, Zn, ITO, alloys thereof, or combinations thereof. In other examples of the inventive concept, each of the plurality of first conductive lines 110 and the plurality of second conductive lines 120 may include a metal film and a conductive barrier film covering at least a portion of the metal film. The conductive barrier film may include, for example, Ti, TiN, Ta, TaN, or combinations thereof.

A plurality of memory cells MC may be formed at a plurality of intersection points between the plurality of first conductive lines 110 and the plurality of second conductive lines 120. The plurality of memory cells MC may store digital information by resistance change between various resistance states including a high resistance state and a low resistance state.

The plurality of memory cells MC may include a plurality of memory cell pillars 140. Insulating walls 150 may each be arranged between the memory cell pillars 140. The plurality of insulating walls 150 include a plurality of first insulating walls 150A and a plurality of second insulating walls 150B, which are alternately arranged between the plurality of memory cell pillars 140 in a row along the first direction (X direction), and a plurality of third insulating walls 150C, which are arranged between the plurality of memory cell pillars 140 in a row along the second direction (Y direction). Each of the plurality of insulating walls 150 extends between adjacent ones of the plurality of memory cell pillars 140 along a direction (Z direction) perpendicular to each of the first direction and the second direction.

As shown in FIGS. 3A and 3B, an interlayer dielectric 104 may be disposed on the substrate 102. The interlayer dielectric 104 may electrically isolate the plurality of first conductive lines 110 from the substrate 102. The interlayer dielectric 104 may include an oxide film, a nitride film, or combinations thereof.

Each of the plurality of memory cell pillars 140 includes a bottom electrode layer BE, a selection device layer 142, an interfacial layer 144, an intermediate electrode layer ME, a heating electrode layer 146, a resistive memory layer 148, and a top electrode layer TE, which are stacked on a first conductive line 110 in this stated order.

Each bottom electrode layer BE, intermediate electrode layer ME, and top electrode layer TE may include a metal, a conductive metal nitride, a conductive metal oxide, or a combination thereof. For example, each of the bottom electrode layer BE, the intermediate electrode layer ME, and the top electrode layer TE may include TiN, TiSiN, TiCN, TiCSiN, TiAlN, Ta, TaN, W, WN, or a combination thereof. In examples of the inventive concept, the bottom electrode layer BE and the top electrode layer TE are omitted. The intermediate electrode layer ME may prevent heat from being transferred from the heating electrode layer 146 to the selection device layer 142.

The selection device layer 142 may correspond to the selection device layer SW shown in FIG. 1. The selection device layer 142 may include an amorphous chalcogenide switching material. The selection device layer 142 may include a material layer capable of having resistance varying depending upon amplitudes of voltages applied to both ends of the selection device layer 142. For example, the selection device layer 142 may include an ovonic threshold switching (OTS) material.

The selection device layer 142 may include a chalcogenide switching material as an OTS material. In examples of the inventive concept, the selection device layer 142 may include Si, Te, As, Ge, In, or a combinations thereof. The selection device layer 142 may further include nitrogen (N). According to the inventive concept, the material constituting the selection device layer 142 is not limited to OTS materials, and the selection device layer 142 may include various material layers capable of functioning to select a device.

The interfacial layer 144 may be interposed between the selection device layer 142 and the intermediate electrode layer ME and protect the selection device layer 142. For example, the interfacial layer 144 may be may be used as an etch stop layer upon a metal etching process for forming the intermediate electrode layer ME in a process of fabricating the memory device 100, thereby preventing the selection device layer 142 from being contaminated with undesired metals. The interfacial layer 144 may include a non-metallic material, for example, carbon (C), without being limited thereto. In examples of the inventive concept, the interfacial layer 144 is omitted.

Although not shown, an additional preliminary interfacial layer may be further inserted between the plurality of first conductive lines 110 and the bottom electrode layer BE, and/or between the bottom electrode layer BE and the selection device layer 142. The additional preliminary interfacial layer may include the same material as the interfacial layer 144.

The heating electrode layer 146 may have an L-shaped cross section in a vertical plane oriented in one direction, e.g., in the X-Z plane. The heating electrode layer 146 includes a base portion 146A (or leg with respect to its L shape) extending parallel to the plurality of first conductive lines 110, and a fin portion 146B (or ascender with respect to its L shape) extending from one end of the base portion 146A in a direction away from the plurality of first conductive lines 110.

The heating electrode layer 146 may heat the resistive memory layer 148 in a set or reset operation. The heating electrode layer 146 may include a material capable of generating sufficient heat for phase-change of the resistive memory layer 148 while not reacting with the resistive memory layer 148. In examples of the inventive concept, the heating electrode layer 146 may include a metal, a metal nitride, an alloy, or a carbon-based conductive material. For example, the heating electrode layer 146 may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or combinations thereof.

In each of the plurality of memory cell pillars 140, a side surface of the selection device layer 142, which faces a first insulating wall 150A, and a side surface of the fin portion 146B of the heating electrode layer 146, which faces the first insulating wall 150A, may be parallel to a first plane, e.g., to the Y-Z plane in FIGS. 3A and 3B. Also, the side surface of the selection device layer 142, which faces the first insulating wall 150A, and the side surface of the fin portion 146B, which faces the first insulating wall 150A, may be aligned along a first straight line L1 coincident with the first plane, i.e., may be vertically coplanar.

In examples of the inventive concept, the intermediate electrode layer ME of each of the plurality of memory cell pillars 140 may have a side surface, which faces the first insulating wall 150A and extends parallel to the first plane. A side surface of the intermediate electrode layer ME, which faces the first insulating wall 150A, may extend along the first straight line L1 together with the side surface of the selection device layer 142, which faces the first insulating wall 150A, and the side surface of the fin portion 146B, which faces the first insulating wall 150A.

In examples of the inventive concept, at least one of the interfacial layer 144 and the bottom electrode layer BE may have a side surface facing the first insulating wall 150A and extending along the first straight line L1.

The resistive memory layer 148 has a bottom surface contacting a top surface 146T that is farthest in the fin portion 146B of the heating electrode layer 146 from a first conductive line 110. The resistive memory layer 148 may correspond to the resistive memory layer RM shown in FIG. 1.

The resistive memory layer 148 may include a phase-change material, which reversibly changes between an amorphous state and a crystalline state depending upon heating time. For example, the resistive memory layer 148 may include a material capable of having a reversible change in phase due to Joule's heat generated by a voltage applied to both ends of the resistive memory layer 148 and having a change in resistance due to such phase change.

In examples of the inventive concept, the resistive memory layer 148 may include a chalcogenide material as the phase-change material. In examples of the inventive concept, the resistive memory layer 148 may include Ge—Sb—Te (GST). For example, the resistive memory layer 148 may include a material such as $Ge_2Sb_2Te_5$, $Ge_2Sb_2Te_7$, $Ge_1Sb_2Te_4$, or $Ge_1Sb_4Te_7$. The resistive memory layer 148 may include various chalcogenide materials other than Ge—Sb—Te set forth above. For example, the resistive memory layer 148 may include, as the chalcogenide material, a material including at least two elements selected from among Si, Ge, Sb, Te, Bi, In, Sn, and Se. In examples of the inventive concept, the resistive memory layer 148 may further include at least one impurity selected from among B, C, N, O, P, and S. The at least one impurity may change a driving current of the memory device 100. In addition, the resistive memory layer 148 may further include a metal. For example, the resistive memory layer 148 may include at least one metal selected from among Al, Ga, Zn, Ti, Cr, Mn, Fe, Co, Ni, Mo, Ru, Pd, Hf, Ta, Ir, Pt, Zr, Tl, Pd, and Po.

The resistive memory layer 148 may have a multilayered structure, in which two or more layers having different properties are stacked. The number or thicknesses of a plurality of layers constituting the multilayered structure may be freely selected. In examples of the inventive concept, the resistive memory layer 148 may have a superlattice structure in which layers of different materials are alternately stacked.

The material constituting the resistive memory layer 148 is not limited to phase-change materials. The resistive memory layer 148 may include various materials having resistance-change properties. In examples of the inventive concept, the resistive memory layer 148 may include a transition metal oxide, and in this case, the memory device 100 may constitute a resistive RAM (ReRAM) device. In other examples of the inventive concept, the resistive memory layer 148 may have a magnetic tunnel junction (MJT) structure, which includes: two electrodes including magnetic substances; and a dielectric between the two magnetic substance electrodes, and in this case, the memory device 100 may constitute a magnetic RAM (MRAM) device.

Figure 4A:
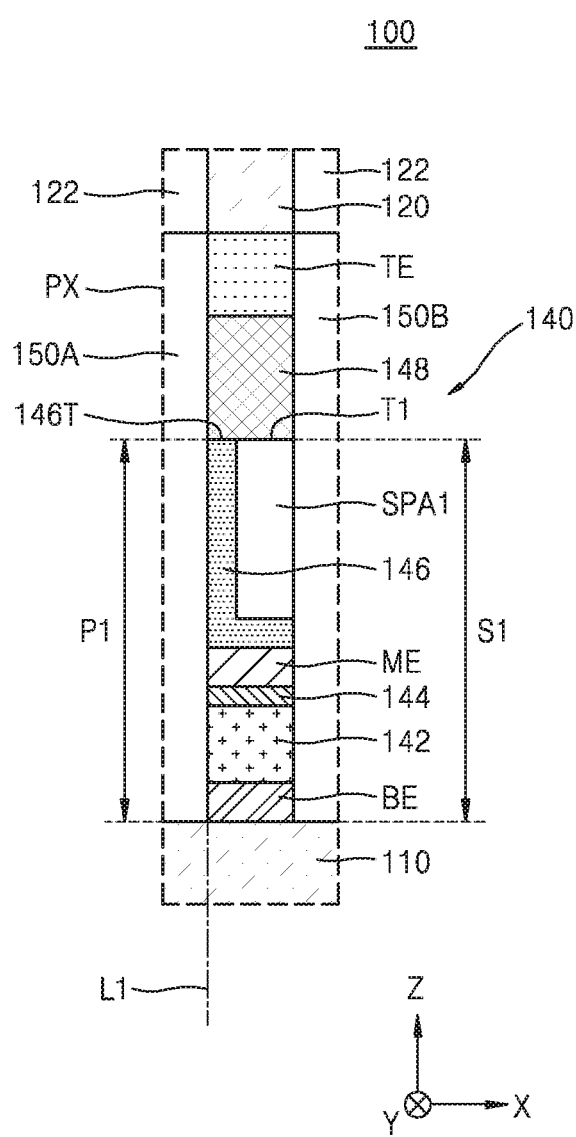
FIG. 4A is a cross-sectional view of a memory cell pillar of an example of a memory device according to the inventive concept.
Figure 4B:
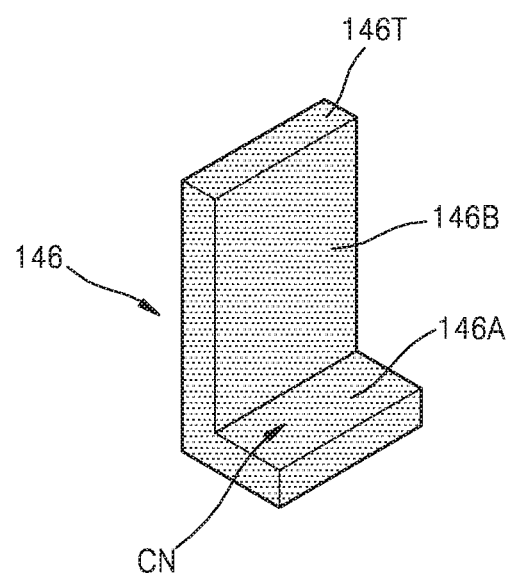
FIG. 4B is an enlarged perspective view of a heating electrode layer of the memory device according to the inventive concept.

FIG. 4A is an enlarged cross-sectional view of an area marked by a dashed line PX of FIG. 3B. FIG. 4B is an enlarged perspective view of the heating electrode layer 146.

Referring to FIGS. 4A and 4B, each of the plurality of memory cell pillars 140 further includes a first insulating spacer SPA1 filling a reentrant corner portion CN, which is defined by the base portion 146A and the fin portion 146B of the heating electrode layer 146. The first insulating spacer SPA1 contacts the bottom surface of the resistive memory layer 148. The area of a first section of the bottom surface of the resistive memory layer 148, which contacts the top surface 146T of the fin portion 146B of the heating electrode layer 146, may be less than the area of a second section of the bottom surface of the resistive memory layer 148, which contacts the first insulating spacer SPA1.

The resistive memory layer 148 may have a side surface, which faces the first insulating wall 150A and extends from the fin portion 146B toward a second conductive line 120 in a direction parallel to the first straight line L1. The top surface 146T of the fin portion 146B and a top surface T1 of the first insulating spacer SPA1, which faces the resistive memory layer 148, may be coplanar. Thus, a distance P1 from the first conductive line 110 to the top surface 146T of the fin portion 146B may be substantially the same as a distance S1 from the first conductive line 110 to the top surface T1 of the first insulating spacer SPA1. The bottom surface of the resistive memory layer 148 may be flat, i.e., may be planar, and may contact the top surfaces 146T/T1 of the fin portion 146B and first insulating spacer SPA1. That is, the resistive memory layer 148 and the heating electrode layer 146/first insulating spacer SPA1 may have an interface at the bottom of the resistive memory layer 148 and the tops of the heating electrode layer 146 and first insulating spacer SPA1.

The examples of the memory device 100 according to the inventive concept, which have been described with reference to FIGS. 2 to 4B, include the heating electrode layer 146 having an L-shaped cross section. The fin portion 146B of the heating electrode layer 146 may contact the bottom surface of the resistive memory layer 148 and have an extremely smaller contact area than the area of the bottom surface of the resistive memory layer 148. Thus, when a current is applied from the intermediate electrode layer ME to the top electrode layer TE through the heating electrode layer 146, the contact area between the fin portion 146B of the heating electrode layer 146 and the resistive memory layer 148 may be minimal, thereby improving heating efficiency. Therefore, even if the components of the memory device having a cross-point stack structure according to the inventive concept are/have been scaled down due to the demand for high integration, the memory device offers high heating efficiency upon a switching operation and thus is highly reliable.

FIGS. 5 to 9 are cross-sectional views respectively illustrating other examples of memory devices according to the inventive concept. In FIGS. 5 to 9, the same reference numerals as in FIGS. 1 to 4B denote the same members, and descriptions thereof will be omitted.

Figure 5:
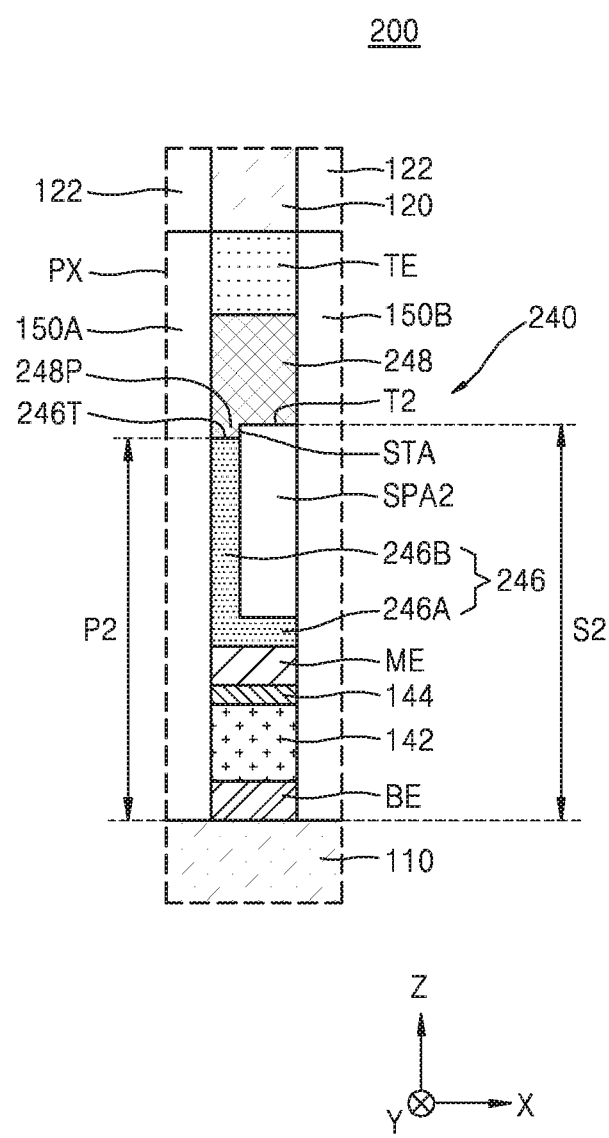
FIGS. 5, 6, 7, 8 and 9 are cross-sectional views respectively illustrating other examples of memory devices according to the inventive concept.

A memory device 200 shown in FIG. 5 has substantially the same configuration as the memory device 100 described with reference to FIGS. 2 to 4B. However, a memory cell pillar 240 of the memory device 200 includes a heating electrode layer 246, which includes a base portion 246A and a fin portion 246B and has an L-shaped cross section.

In the memory cell pillar 240, a distance P2 from the first conductive line 110 to a top surface 246T of the fin portion 246B of the heating electrode layer 246 is less than a distance S2 from the first conductive line 110 to a top surface T2 of a first insulating spacer SPA2. The memory cell pillar 240 of the memory device 200 includes a resistive memory layer 248 having a protrusion 248P at a bottom surface thereof. In the bottom of the resistive memory layer 248, a step STA provided by a side surface of the protrusion 248P is formed between a first section of the bottom surface facing the top surface 246T and a second section of the bottom surface facing the first insulating spacer SPA2. The protrusion 248P of the resistive memory layer 248 is between the first insulating wall 150A and the first insulating spacer SPA2, and protrudes toward the first conductive line 110 to contact the top surface 246T of the fin portion 246B.

The heating electrode layer 246, the first insulating spacer SPA2, and the resistive memory layer 248 are substantially the same as the heating electrode layer 146, the first insulating spacer SPA1, and the resistive memory layer 148 described with reference to FIGS. 2 to 4B.

Figure 6:
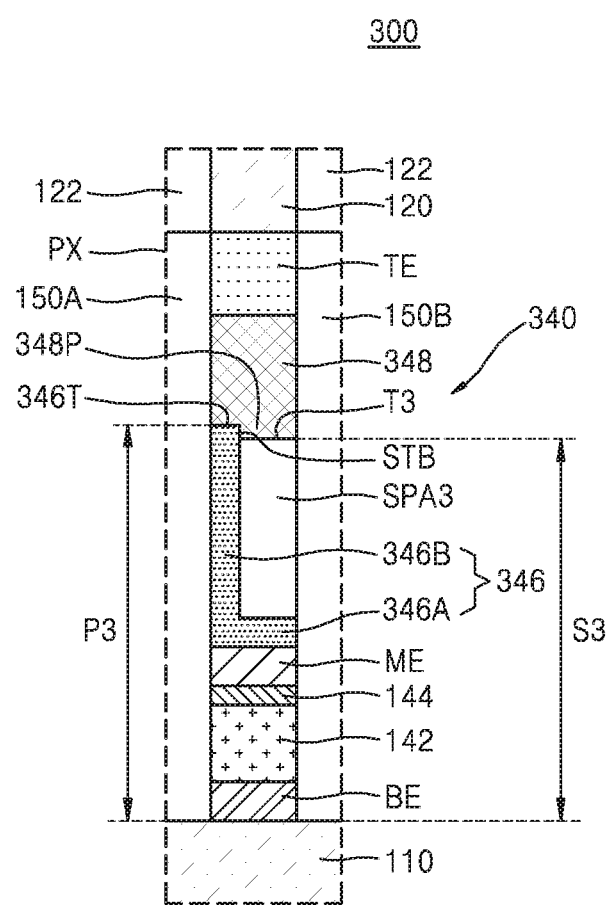

A memory device 300 shown in FIG. 6 has substantially the same configuration as the memory device 100 described with reference to FIGS. 2 to 4B. However, a memory cell pillar 340 of the memory device 300 includes a heating electrode layer 346, which includes a base portion 346A and a fin portion 346B and has an L-shaped cross-section.

In the memory device 300, a distance P3 from the first conductive line 110 to a top surface 346T of the fin portion 346B is greater than a distance S3 from the first conductive line 110 to a top surface T3 of a first insulating spacer SPA3. A bottom surface of a resistive memory layer 348 includes a step STB between a first section of the bottom surface facing the top surface 346T and a second section of the bottom surface facing the first insulating spacer SPA3. A resistive memory layer 348 includes a protrusion 348P, which is between a second insulating wall 150B and the first insulating spacer SPA3 and protrudes toward the first conductive line 110 to contact the top surface T3 of the first insulating spacer SPA3.

The heating electrode layer 346, the first insulating spacer SPA3, and the resistive memory layer 348 are substantially the same heating electrode layer 146, the first insulating spacer SPA1, and the resistive memory layer 148 described with reference to FIGS. 2 to 4B.

Figure 7:
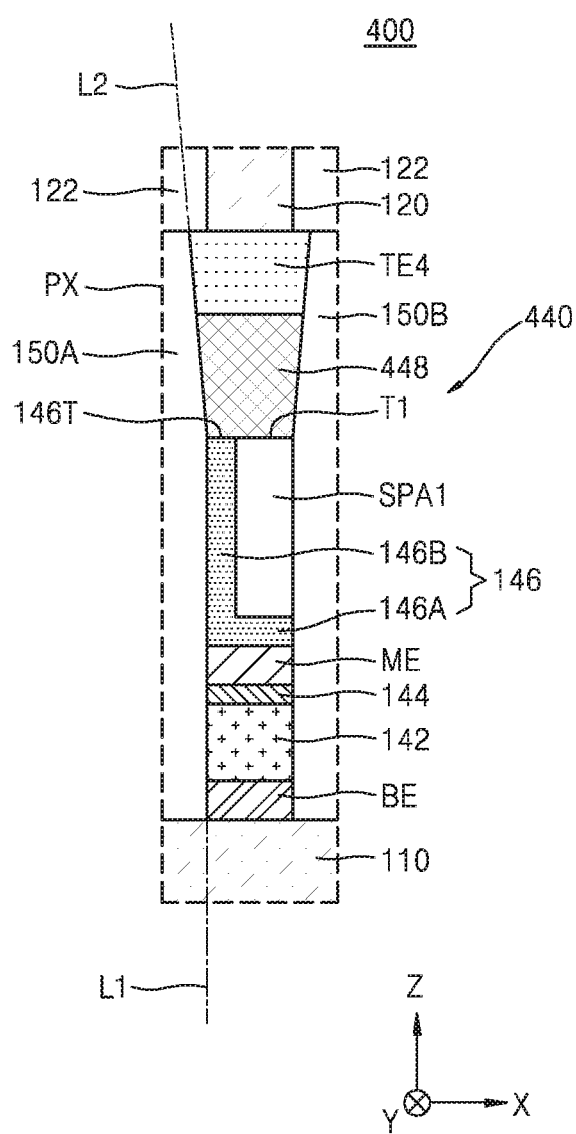

A memory device 400 shown in FIG. 7 has substantially the same configuration as the memory device 100 described with reference to FIGS. 2 to 4B. However, a memory cell pillar 440 of the memory device 400 includes a resistive memory layer 448 having an inclined side surface and a top electrode layer TE4 having an inclined side surface.

In more detail, in the memory device 400, each of the resistive memory layer 448 and the top electrode layer TE4 has inclined side surfaces respectively facing the first insulating wall 150A and the second insulating wall 150B. The inclined side surface of the resistive memory layer 448 may extend from the fin portion 146B of the heating electrode layer 146 toward the top electrode layer TE4 along a second straight line L2 that is not parallel to the first straight line L1. The inclined side surface of the top electrode layer TE4 may extend from the resistive memory layer 448 toward the second conductive line 120 along the second straight line L2. Each of the resistive memory layer 448 and the top electrode layer TE4 may have an increasing width in the first direction (X direction) and/or in the second direction (Y direction) with decreasing distance from the second conductive line 120. In examples of the inventive concept, each of the resistive memory layer 448 and the top electrode layer TE4 may have a reverse truncated pyramid shape.

Note, in the present disclosure, the "bottom surface" of the resistive memory layer 148, 248, 348, 448, for example, may therefore refer to any downwardly facing surfaces or downwardly facing sections of a surface.

Descriptions of the resistive memory layer 448 and the top electrode layer TE4 are substantially the same as described as to the resistive memory layer 148 and the top electrode layer TE with reference to FIGS. 2 to 4B.

Figure 8:
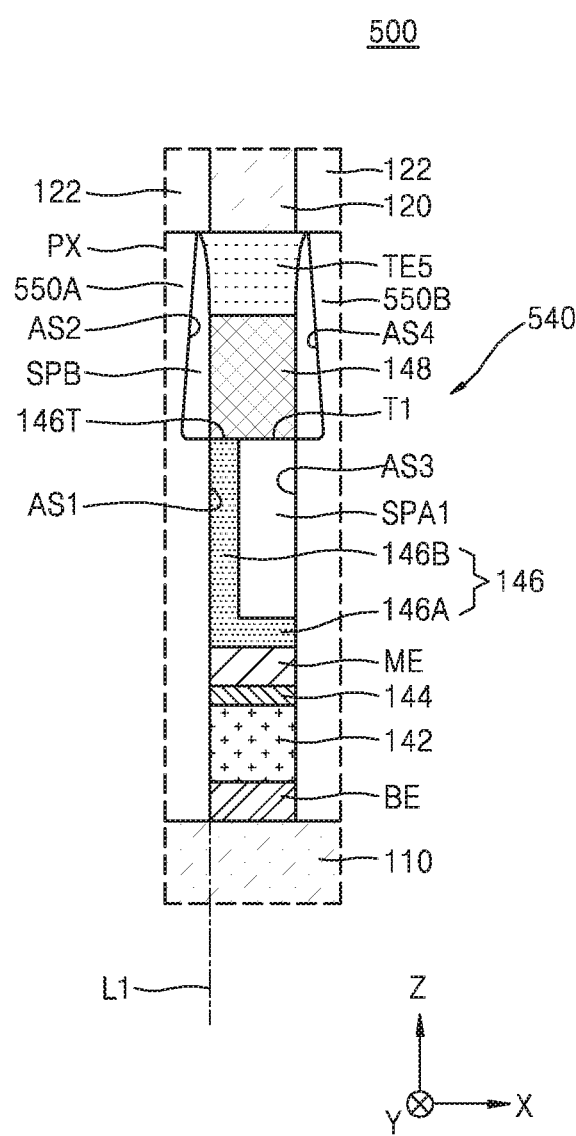

A memory device 500 shown in FIG. 8 has substantially the same configuration as the memory device 100 described with reference to FIGS. 2 to 4B. However, a memory cell pillar 540 of the memory device 500 includes a second insulating spacer SPB between the top surface 146T of the fin portion 146B of the heating electrode layer 146 and the second conductive line 120, the second insulating spacer SPB having a ring shape surrounding the resistive memory layer 148 and a top electrode layer TE5. The top electrode layer TE5 may have increasing widths in the first direction (X direction) and in the second direction (Y direction) with decreasing distance from the second conductive line 120.

In the memory device 500, a first insulating wall 550A includes a flat side surface AS1, which contacts the fin portion 146B of the heating electrode layer 146 and extends along the first straight line L1, and a recessed side surface AS2, which faces the resistive memory layer 148 and the top electrode layer TE5 and is recessed in a direction away from the resistive memory layer 148 and the top electrode layer TE5. Like the first insulating wall 550A, a second insulating wall 550B may include a flat side surface AS3, which contacts the first insulating spacer SPA1 and extends along a straight line parallel to the first straight line L1, and a recessed side surface AS4, which faces the resistive memory layer 148 and the top electrode layer TE5 and is recessed in a direction away from the resistive memory layer 148 and the top electrode layer TE5.

The second insulating spacer SPB may cover the resistive memory layer 148 and the recessed side surfaces AS2 and AS4. In examples of the inventive concept, the second insulating spacer SPB may include an oxide film, a nitride film, an oxynitride film, or combinations thereof.

The first insulating wall 550A, the second insulating wall 550B, and the top electrode layer TE5 are substantially the same as the first insulating wall 150A, the second insulating wall 150B, and the top electrode layer TE described with reference to FIGS. 2 to 4B.

Figure 9:
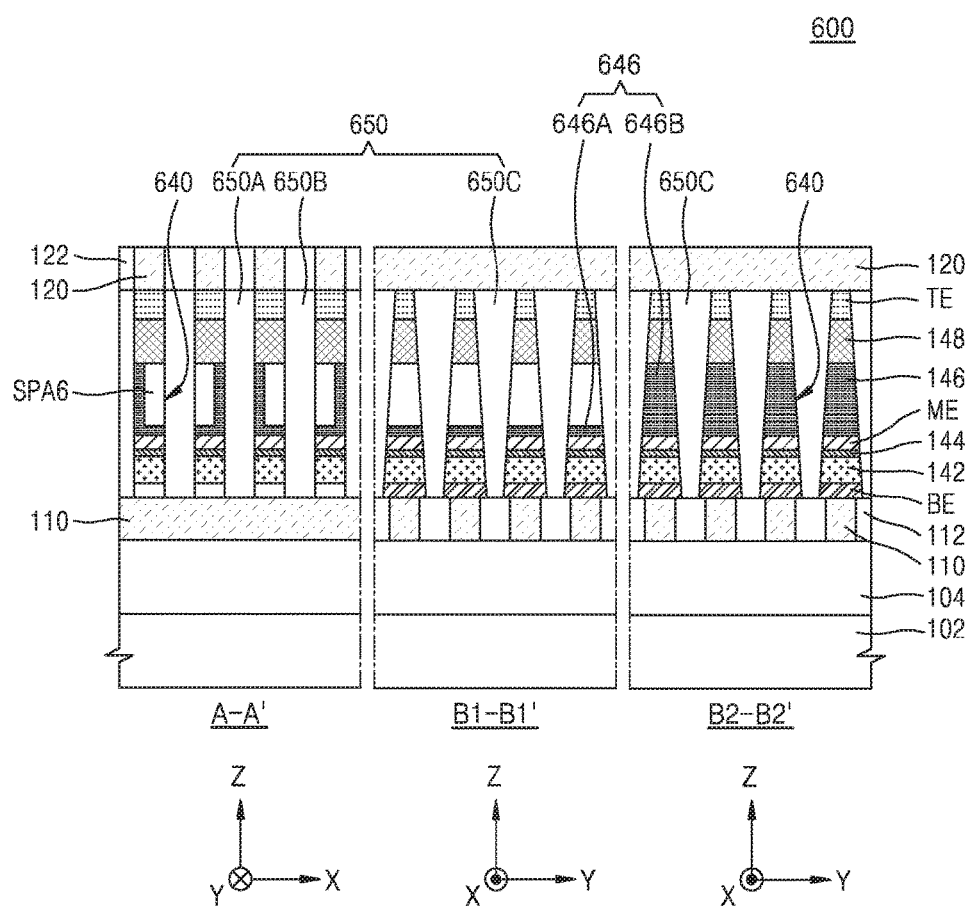

A memory device 600 shown in FIG. 9 has substantially the same configuration as the memory device 100 described with reference to FIGS. 2 to 4B. However, the memory device 600 includes a plurality of memory cell pillars 640 having inclined side surfaces, and third insulating walls 650C having inclined side surfaces.

In the memory device 600, among a plurality of insulating walls 650, a plurality of third insulating walls 650C may have inclined side surfaces. In more detail, both side surfaces of each third insulating wall 650C may be inclined with respect to a straight line that extends along the third direction (Z direction) perpendicular to each of the first direction (X direction) and the second direction (Y direction). The memory cell pillars 640 have inclined side surfaces facing the third insulating walls 650C. Thus, a side surface of a heating electrode layer 646, which faces each third insulating wall 650C, and a side surface of a first insulating spacer SPA6, which faces the third insulating wall 650C, may extend parallel to an inclined side surface of the third insulating wall 650C. In examples of the inventive concept, each third insulating wall 650C may have an increasing width in the second direction (Y direction) as the third insulating layer 650C gets closer to the second conductive line 120 from the first conductive line 110.

The heating electrode layer 646 may include a base portion 646A (or leg with reference to the L-shaped cross section thereof) and a fin portion 646B (or ascender). As shown in a cross-sectional view taken along a line B2-B2' of FIG. 9, the fin portion 646B of the heating electrode layer 646 may have a decreasing width in the second direction (Y direction) as the fin portion 646B gets closer to the second conductive line 120 from the first conductive line 110.

The heating electrode layer 646, the first insulating spacer SPA6, and the third insulating walls 650C are substantially the same as to the heating electrode layer 146, the first insulating spacer SPA1, and the third insulating walls 150C described with reference to FIGS. 2 to 4B.

Figure 10A:
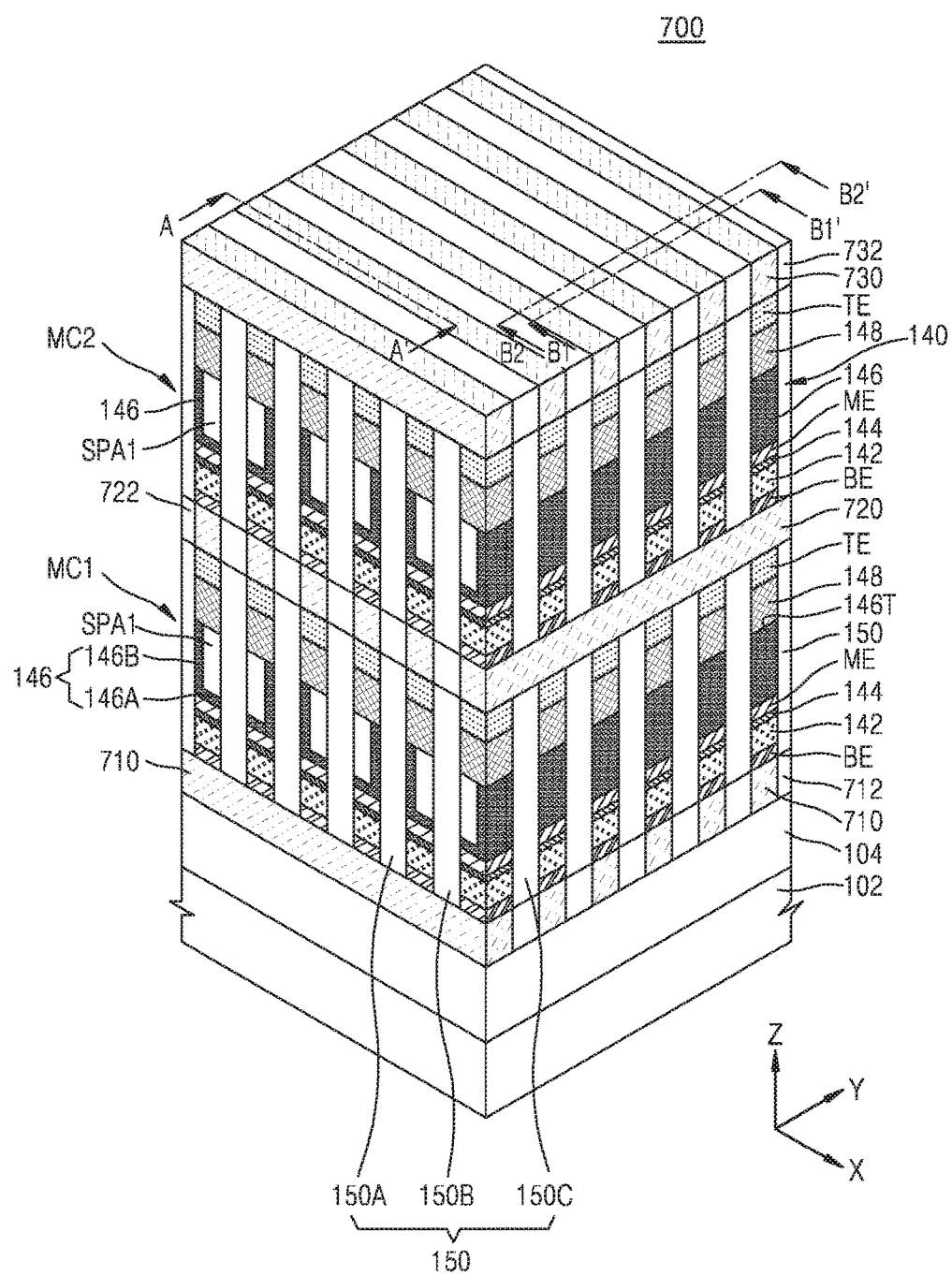
FIG. 10A is a perspective view illustrating main components of another example of a memory device according to the inventive concept.
Figure 10B:
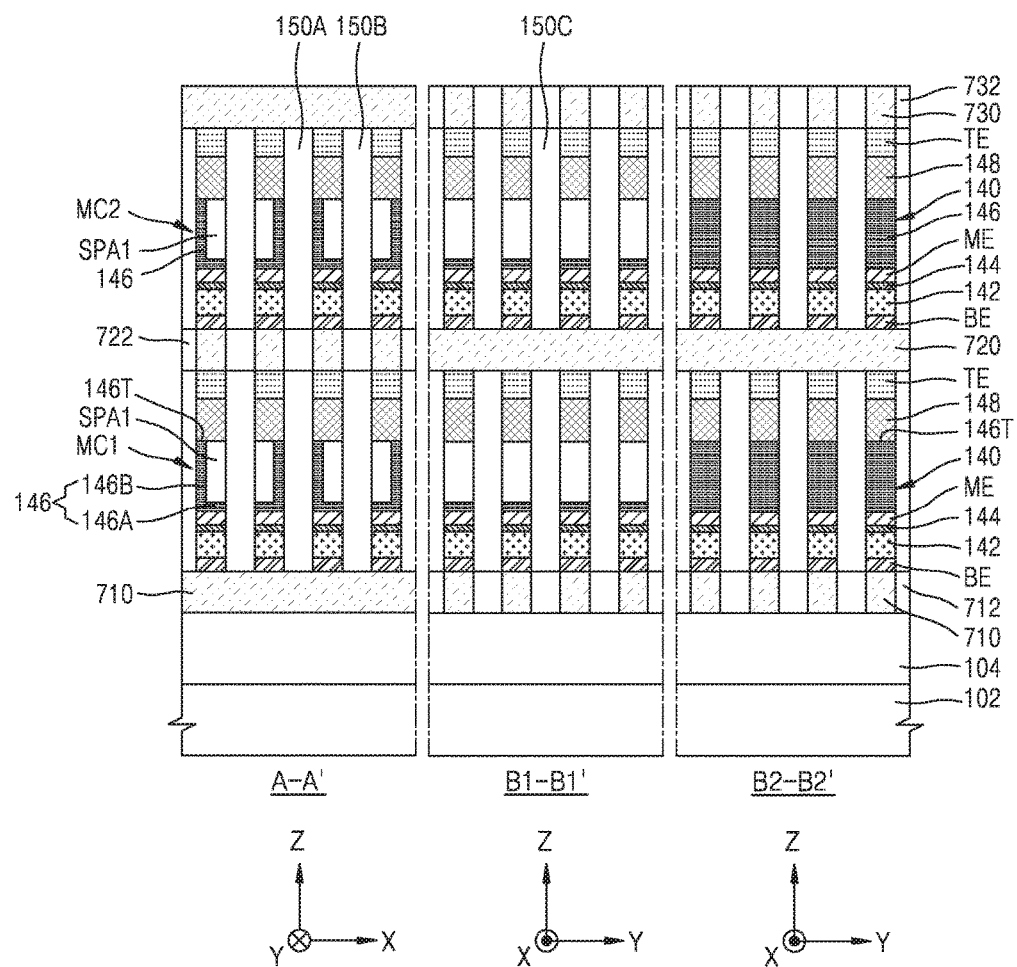
FIG. 10B illustrates cross-sectional views of the main components, respectively taken along lines A-A', B1-B1', and B2-B2' of FIG. 10A.

FIGS. 10A and 10B are diagrams illustrating another example of a memory device according to of the inventive concept, and in particular, FIG. 10A is a perspective view illustrating main components of a memory device 700, and FIG. 10B illustrates cross-sectional views of the main components, respectively taken along lines A-A', B1-B1', and B2-B2' of FIG. 10A. In FIGS. 10A and 10B, the same reference numerals as in FIGS. 3A and 3B denote the same members, and descriptions thereof will be omitted.

Referring to FIGS. 10A and 10B, the memory device 700 may include a plurality of lower word lines 710 extending parallel to each other over the substrate 102 in the first direction (X direction), a plurality of common bit lines 720 extending parallel to each other in the second direction (Y direction), and a plurality of top word lines 730 extending parallel to each other in the first direction (X direction). The plurality of bottom word lines 710 and the plurality of common bit lines 720 may correspond to the plurality of first conductive lines 110 and the plurality of second conductive lines 120, which are shown in FIGS. 3A and 3B.

First memory cells MC1 may be respectively arranged at a plurality of intersection points between the plurality of bottom word lines 710 and the plurality of common bit lines 720. Second memory cells MC2 may be respectively arranged at a plurality of intersection points between the plurality of common bit lines 720 and the plurality of top word lines 730.

Similarly to the memory cell MC described with reference to FIGS. 3A and 3B, each of the plurality of first memory cells MC1 and the plurality of second memory cells MC2 may include a memory cell pillar 140. The plurality of first memory cells MC1 and the plurality of second memory cells MC2 may be insulated from each other by the plurality of insulating walls 150.

Figure 11:
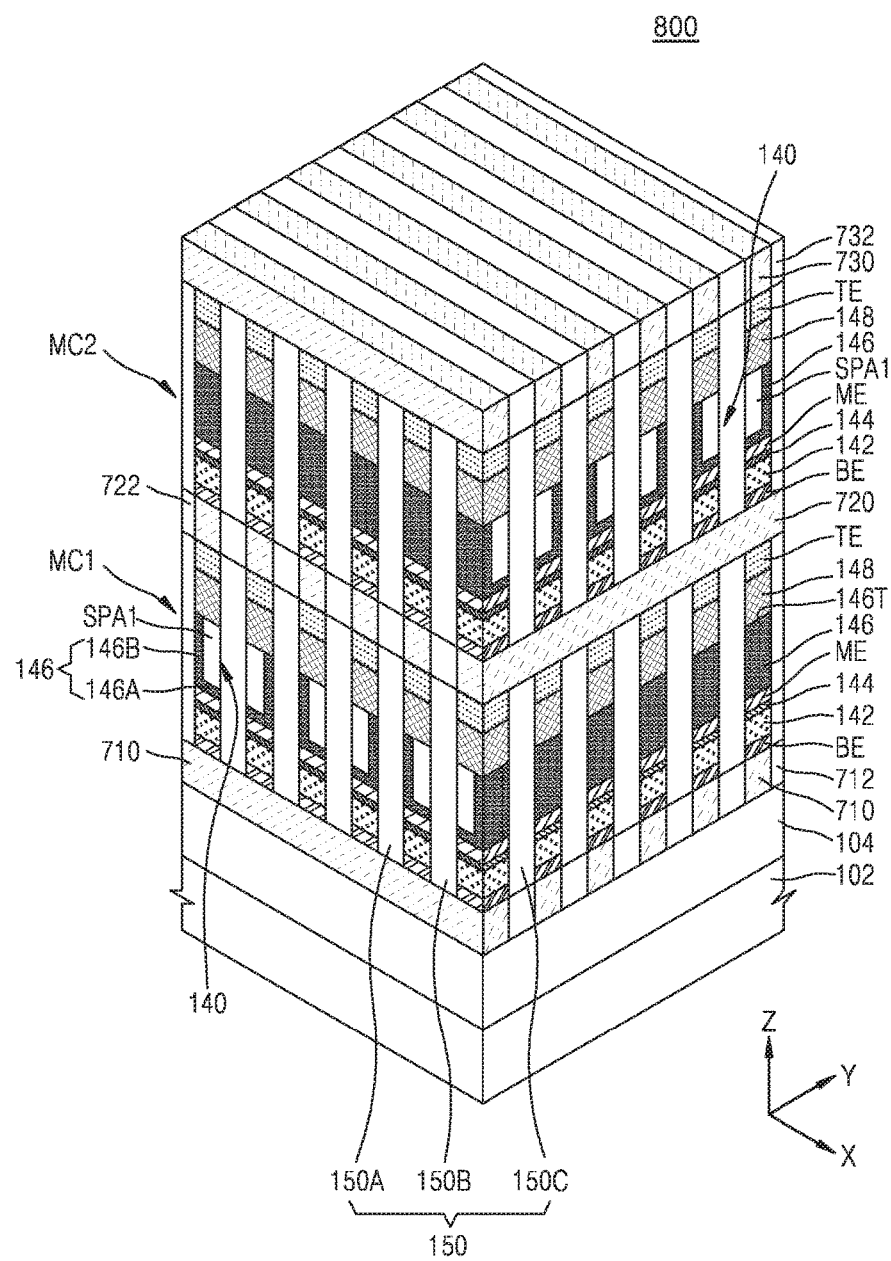
FIG. 11 is a perspective view illustrating a further example of a memory device according to the inventive concept.

FIG. 11 is a perspective view illustrating a further example of a memory device according to the inventive concept.

Referring to FIG. 11, a memory device 800 has substantially the same configuration as the memory device 700 described with reference to FIGS. 10A to 10B. However, in the memory device 800, the memory cell pillars 140 constituting the plurality of first memory cells MC1 and the memory cell pillars 140 constituting the plurality of second memory cells MC2 may be congruent with each other as a whole, i.e., may be rotated by 90° with respect to each other.

The angle of offset of the memory cell pillars 140 constituting the plurality of second memory cells MC2 with respect to the memory cell pillars 140 constituting the plurality of first memory cells MC1 is not limited to the example shown in FIG. 11, and may be different than 90° as the need arises.

Although FIGS. 10A, 10B, and 11 show that each of the plurality of first memory cells MC1 and the plurality of second memory cells MC2 includes a memory cell pillar 140 of the type illustrated in FIGS. 3A and 3B, the inventive concept is not limited thereto. For example, each of the plurality of first memory cells MC1 and the plurality of second memory cells MC2 may have a memory cell pillar structure selected from among the memory cell pillars 240, 340, 440, 540, and 640 and structures modified and changed therefrom without departing from the spirit and scope of the inventive concept.

Figure 12A:
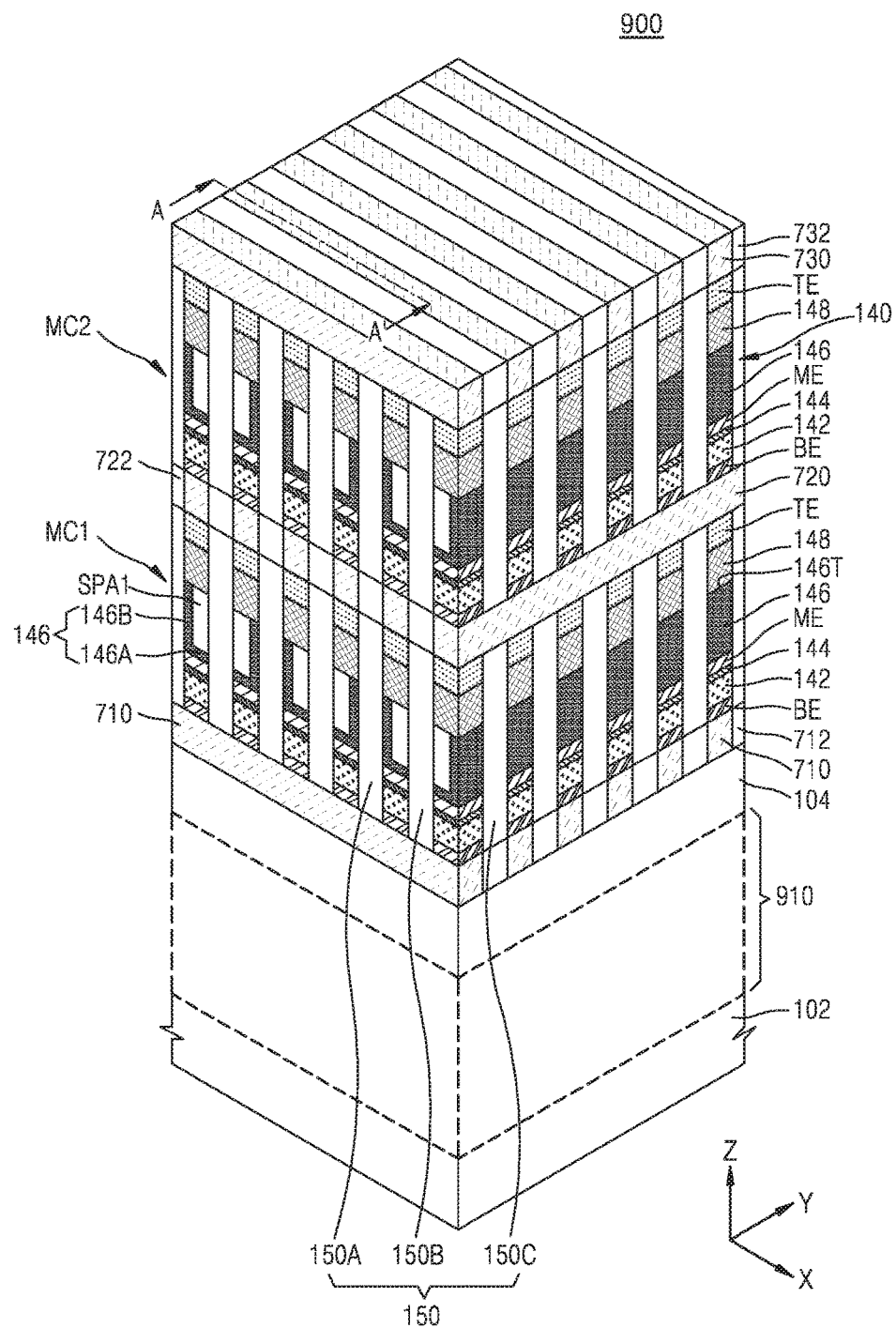
FIG. 12A is a perspective view illustrating main components of yet another example of a memory device according to the inventive concept.
Figure 12B:
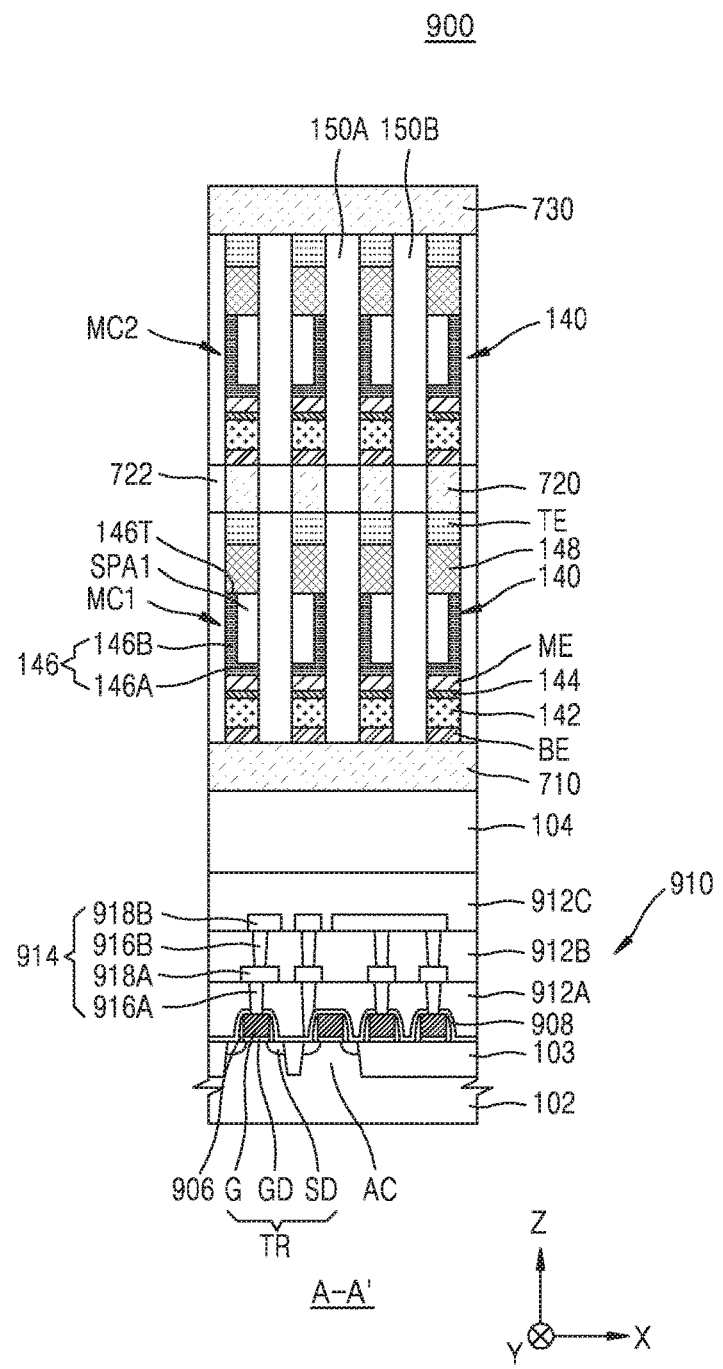
FIG. 12B illustrates a cross-sectional view of the main components, taken along line A-A' of FIG. 12A.

FIGS. 12A and 12B are diagrams illustrating yet another example of a memory device according to of the inventive concept, and in particular, FIG. 12A is a perspective view illustrating main components of a memory device 900, and FIG. 12B illustrates a cross-sectional view of the main components, taken along a line A-A' of FIG. 12A. In FIGS. 12A and 12B, the same reference numerals as in FIGS. 3A and 3B denote the same members, and descriptions thereof will be omitted.

Referring to FIGS. 12A and 12B, the memory device 900 includes a driving circuit area 910 on the substrate 102 and has a cell-on-peri (COP) structure, in which memory cells are arranged over the driving circuit area 910.

In more detail, the memory device 900 includes the driving circuit area 910 at a first level over the substrate 102, and the plurality of first memory cells MC1 and the plurality of second memory cells MC2, which are at higher levels than the first level over the substrate 102. As used herein, the term "level" refers to a location along a vertical direction (Z direction) from the substrate 102.

The driving circuit area 910 may be an area in which peripheral circuits or driving circuits for driving the plurality of first memory cells MC1 and the plurality of second memory cells MC2 are arranged. The peripheral circuits arranged in the driving circuit area 910 may be circuits capable of processing data at high speed, the data being input/output to drive the plurality of first memory cells MC1 and the plurality of second memory cells MC2. In examples of the inventive concept, the peripheral circuits may include a page buffer, a latch circuit, a cache circuit, a column decoder, a sense amplifier, a data in/out circuit, a row decoder, or the like.

As shown in FIG. 12B, an active region AC may be defined in the substrate 102 by a device isolation film 103. A plurality of transistors TR constituting the driving circuit area 910 may be formed on the active region AC of the substrate 102. Each of the plurality of transistors TR may include a gate G, a gate insulating film GD, and a source/drain region SD. An insulating spacer 906 may cover both side surfaces of the gate G, and an etch stop film 908 may be formed on the gate G and the insulating spacer 906. The etch stop film 908 may include an insulating material such as silicon nitride, silicon oxynitride, or the like. Interlayer dielectrics 912A, 912B, and 912C may be stacked on the etch stop film 908 in this stated order. The interlayer dielectrics 912A, 912B, and 912C may include silicon oxide, silicon oxynitride, or the like.

The driving circuit area 910 includes a multilayer wiring structure 914 electrically connected to the plurality of transistors TR. Elements of the multilayered wiring structure 914 may be insulated from each other by the plurality of interlayer dielectrics 912A, 912B, and 912C. The multilayer wiring structure 914 may include a first contact 916A, a first wiring layer 918A, a second contact 916B, and a second wiring layer 918B, which are stacked over the substrate 102 in this stated order and electrically connected to each other. Each of the first wiring layer 918A and the second wiring layer 918B may include a metal, a conductive metal nitride, a metal silicide, or combinations thereof. Although the multilayer wiring structure 914 is shown in FIGS. 12A and 12B as being a double-layer wiring structure including the first wiring layer 918A and the second wiring layer 918B, the inventive concept is not limited thereto. For example, the multilayer wiring structure 914 may include three or more layers depending upon layouts of the driving circuit area 910 and kinds and arrangements of gates G.

The interlayer dielectric 104 may be formed on the plurality of interlayer dielectrics 912A, 912B, and 912C. Although not shown, a wiring structure connecting the plurality of first memory cells MC1 and the plurality of second memory cells MC2 to the driving circuit area 910 may extend through the interlayer dielectric 104.

In the memory device 900, because the plurality of first memory cells MC1 and the plurality of second memory cells MC2 are arranged over the driving circuit area 910, the degree of integration of the memory device 900 may be relatively great.

Next, an example of a method of fabricating a memory device, according to the inventive concept, will be described in detail.

Figure 13A:
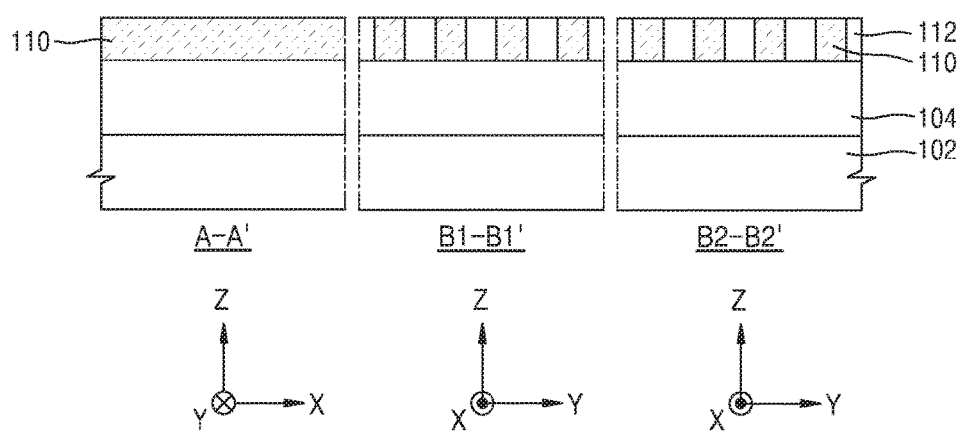
FIGS. 13A, 13B, 13C, 13D, 13E, 13F, 13G, 13H, 13I, 13J, 13K, 13L, 13M, 13N, 13O, 13P, 13Q and 13R are cross-sectional views of a memory device during the course of its manufacture and together illustrate an example of a method of fabricating a memory device, according to the inventive concept.
Figure 13B:
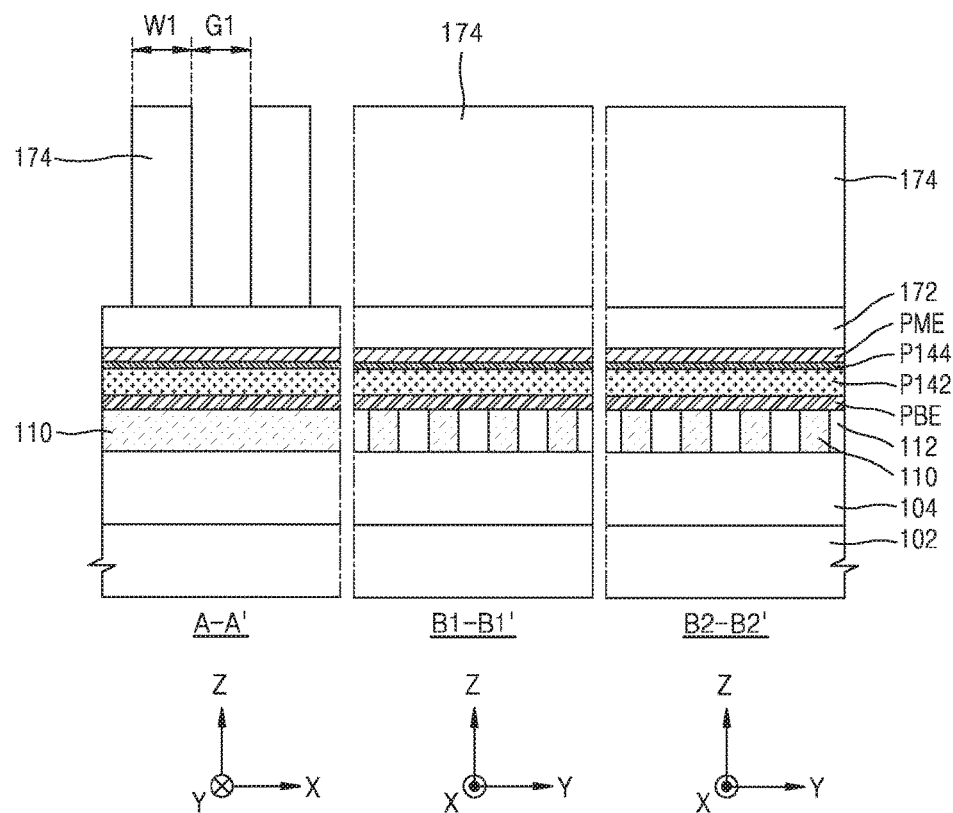
Figure 13C:
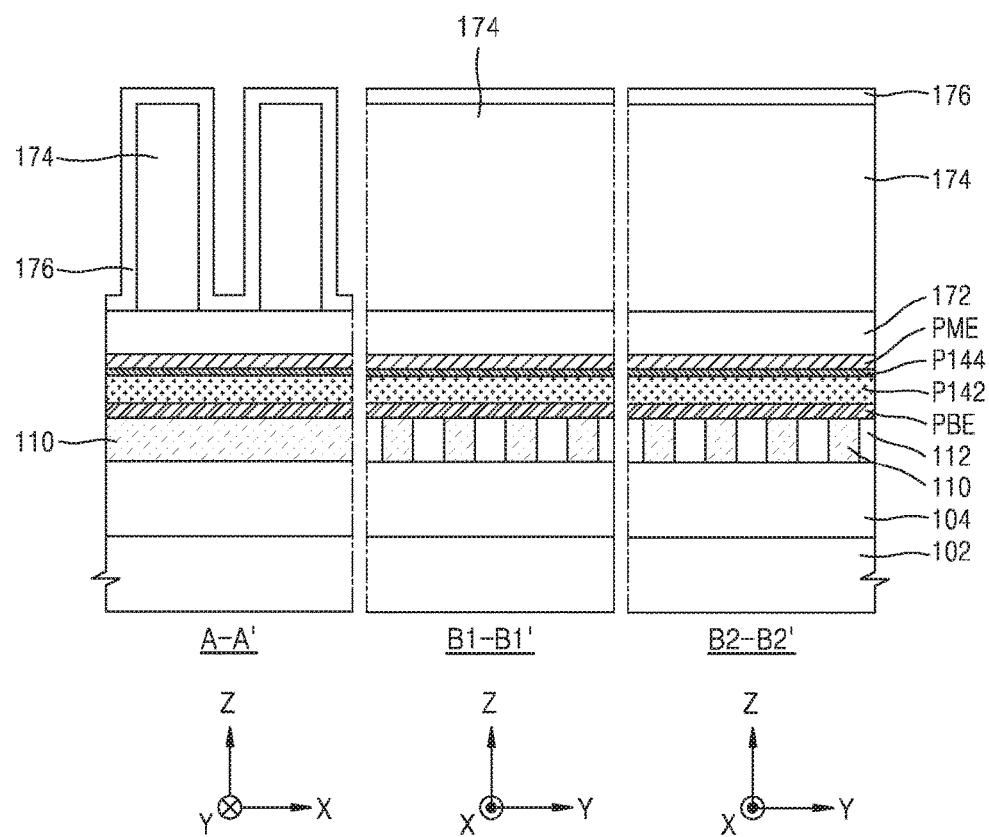
Figure 13D:
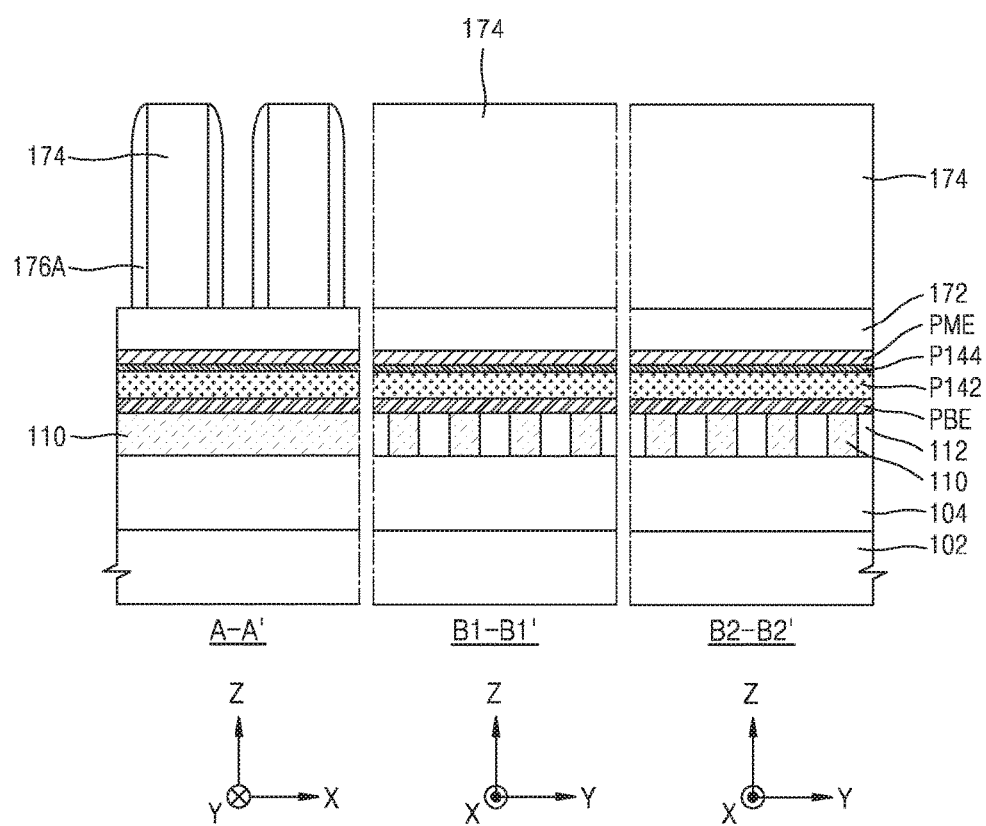
Figure 13E:
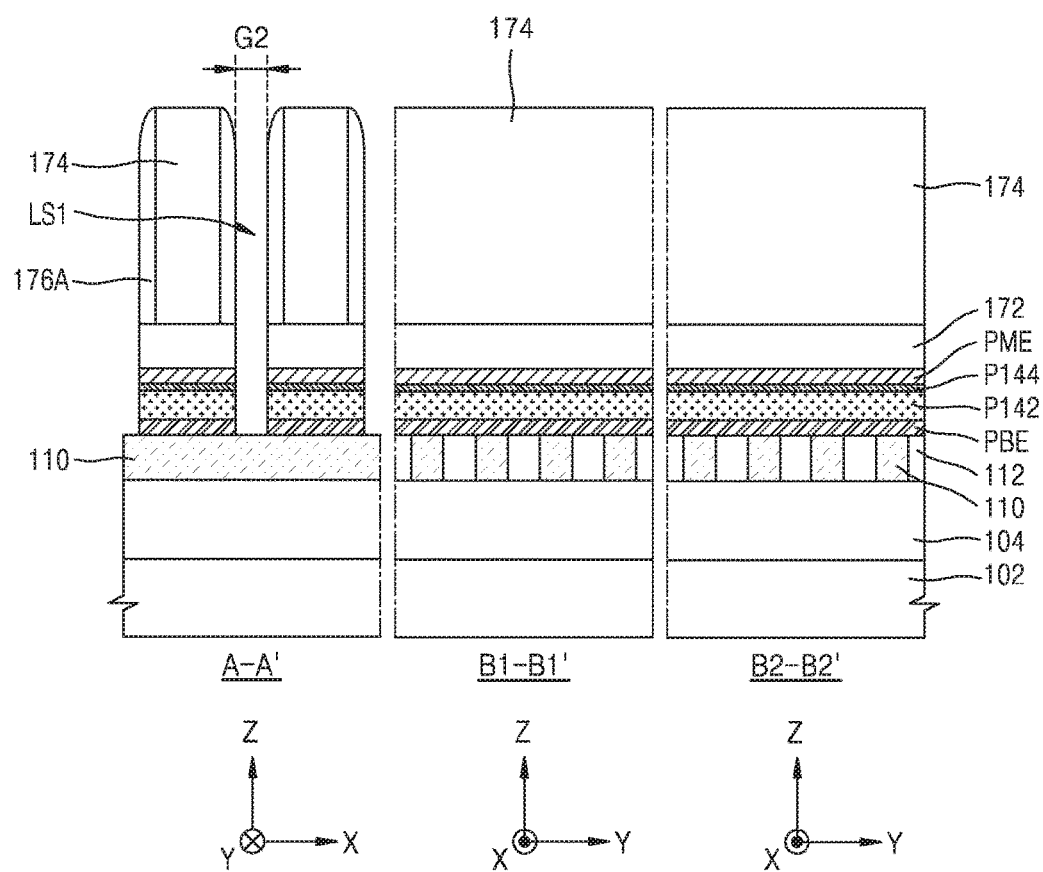
Figure 13F:
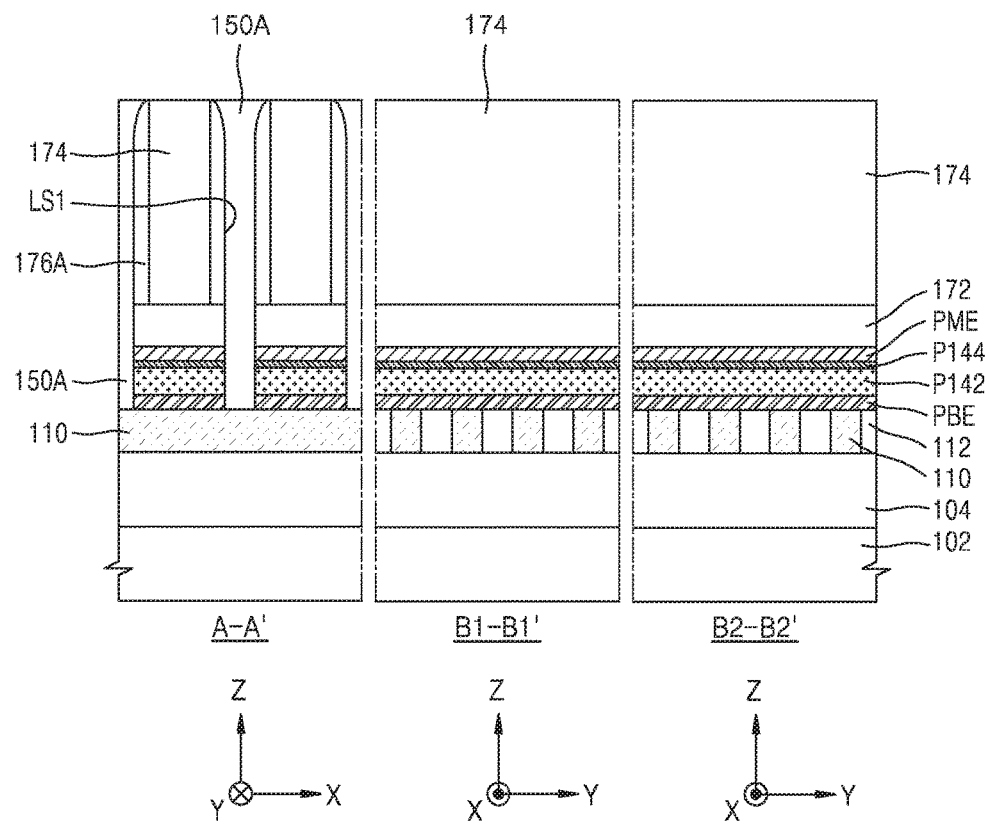
Figure 13G:
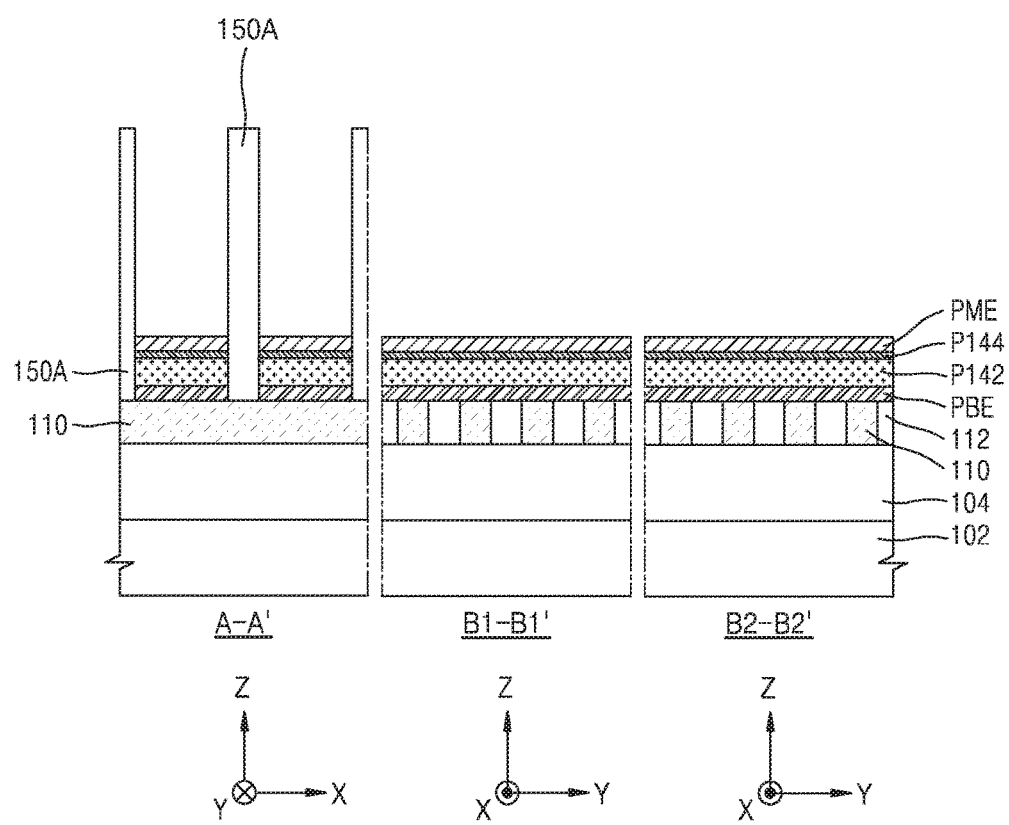
Figure 13H:
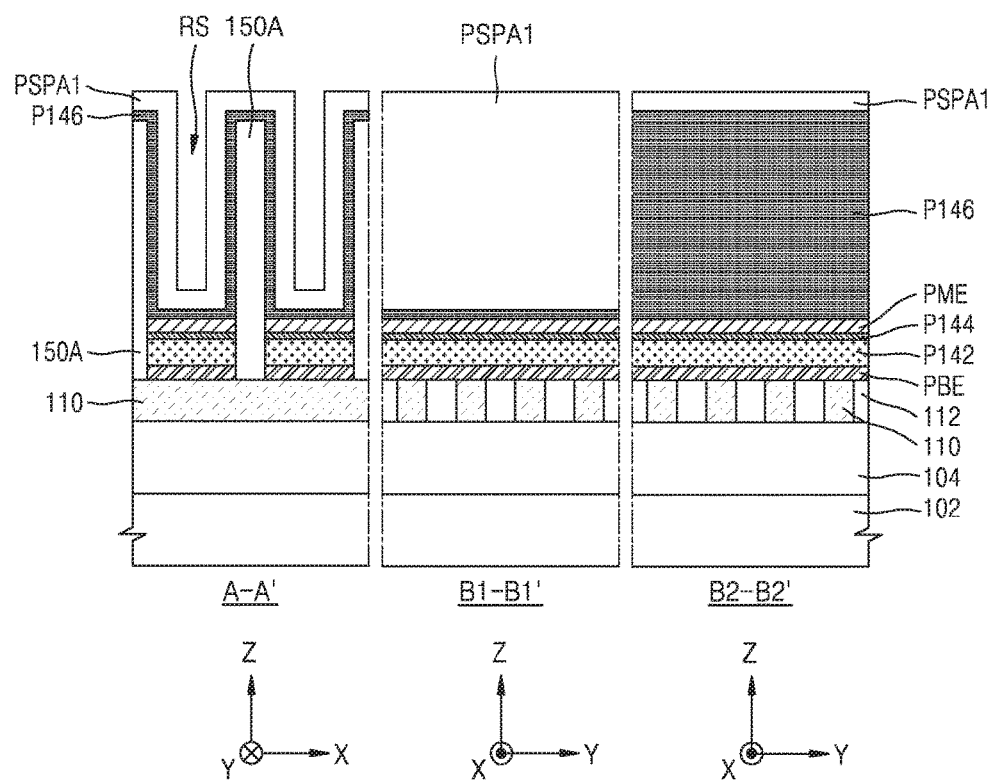
Figure 13I:
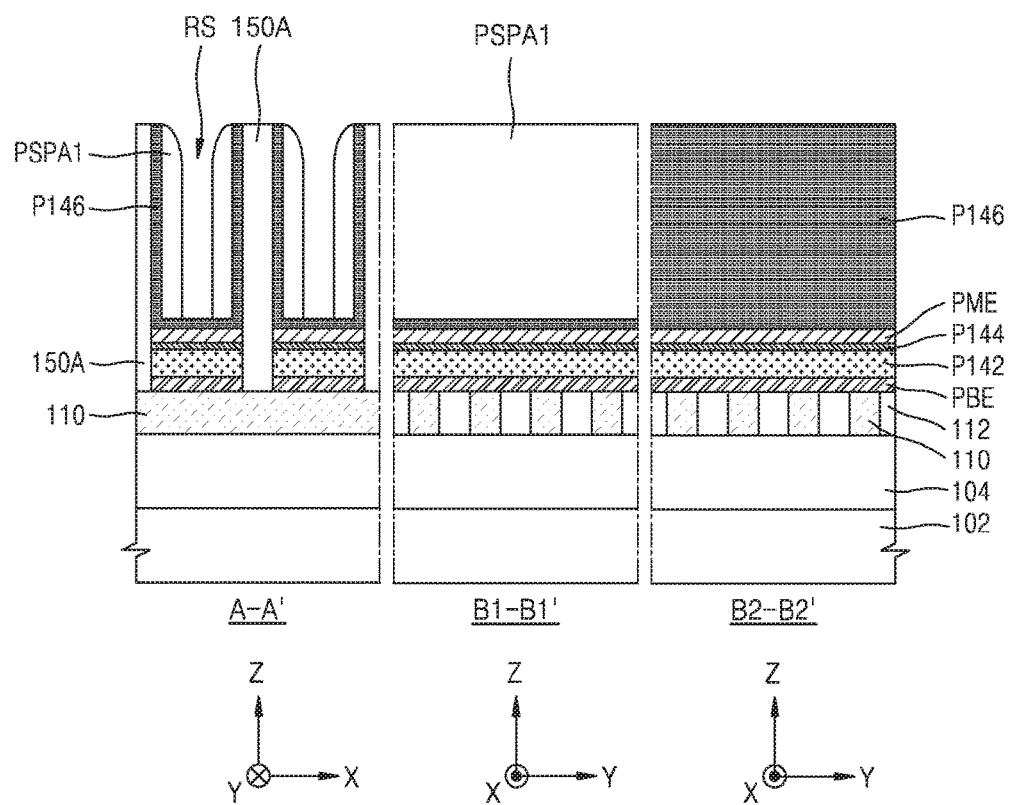
Figure 13J:
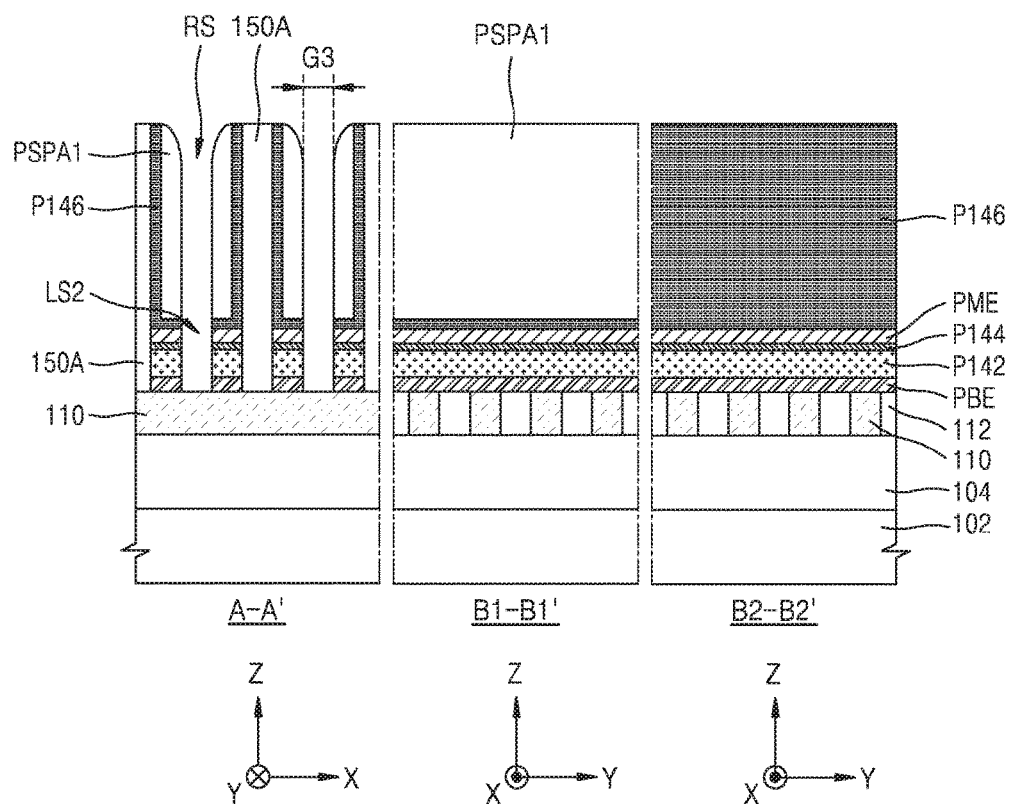
Figure 13K:
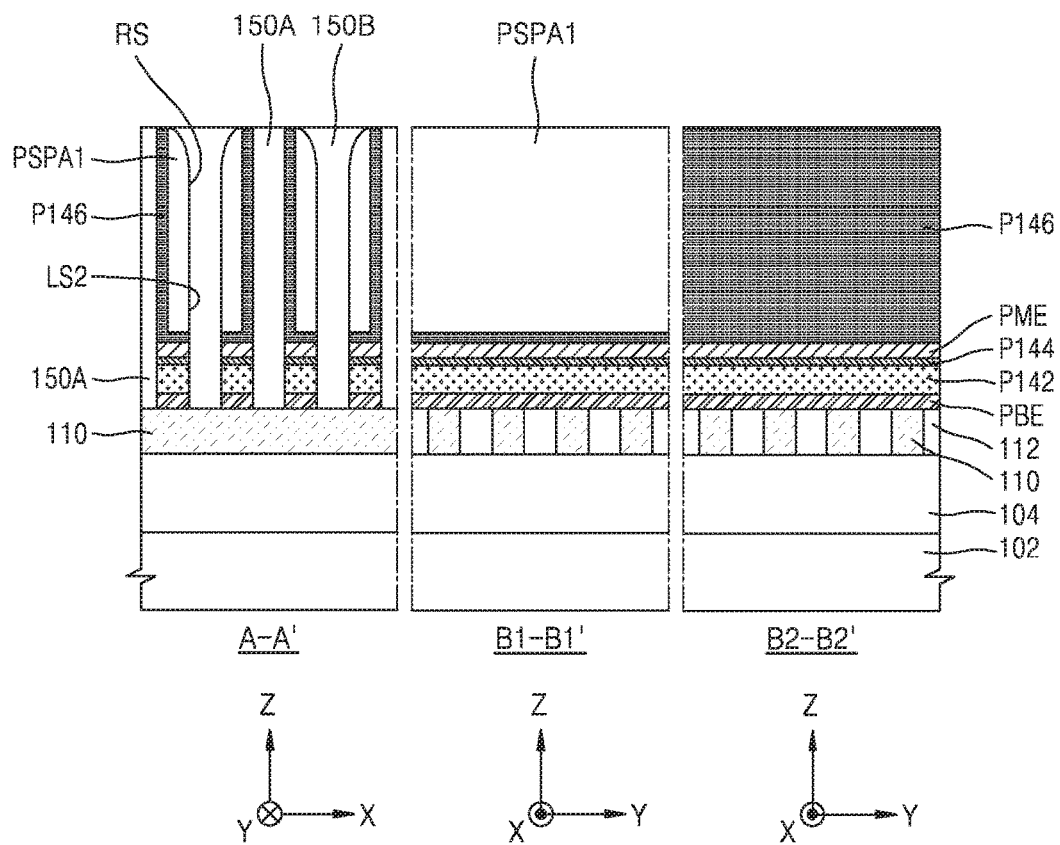
Figure 13L:
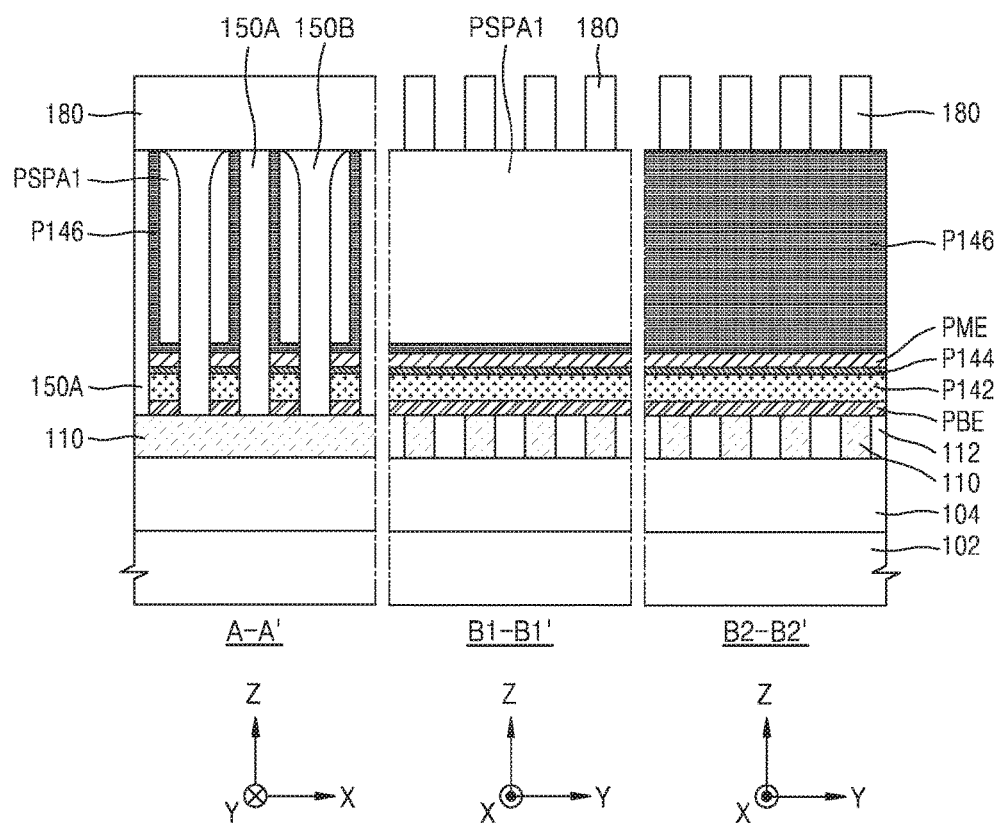
Figure 13M:
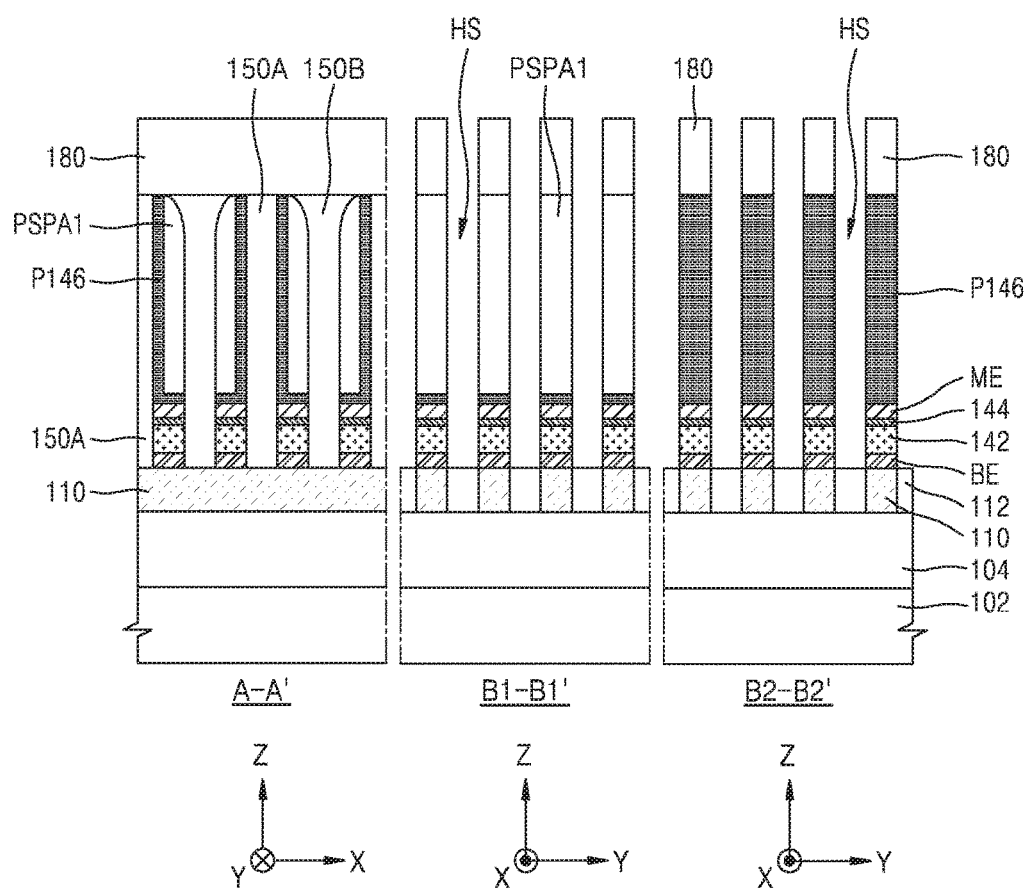
Figure 13N:
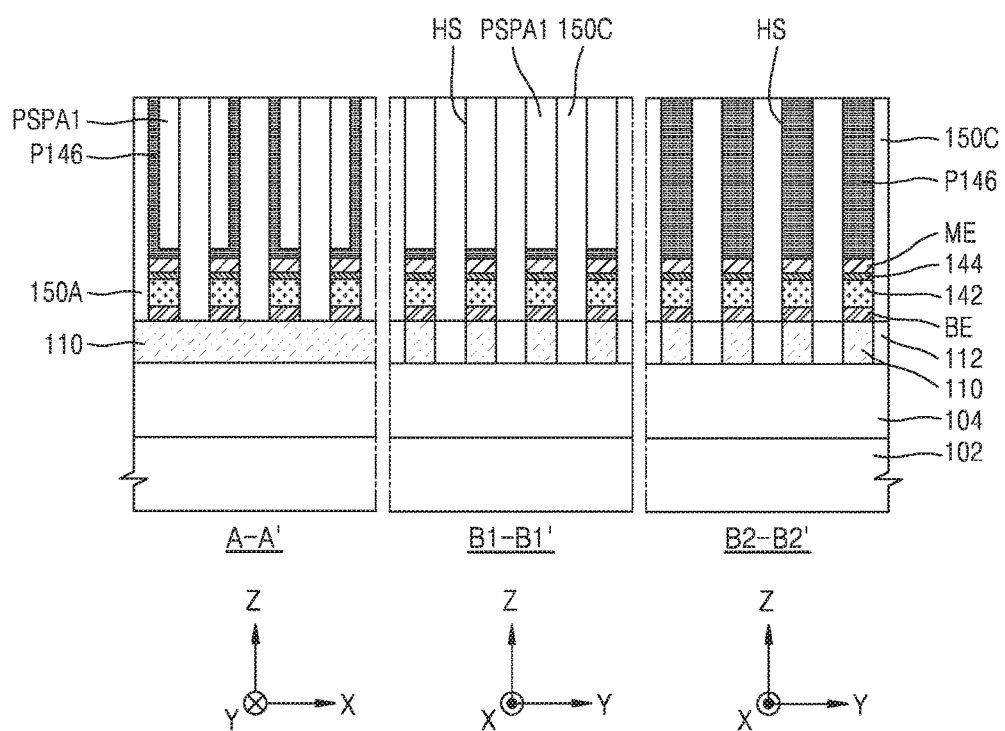
Figure 13O:
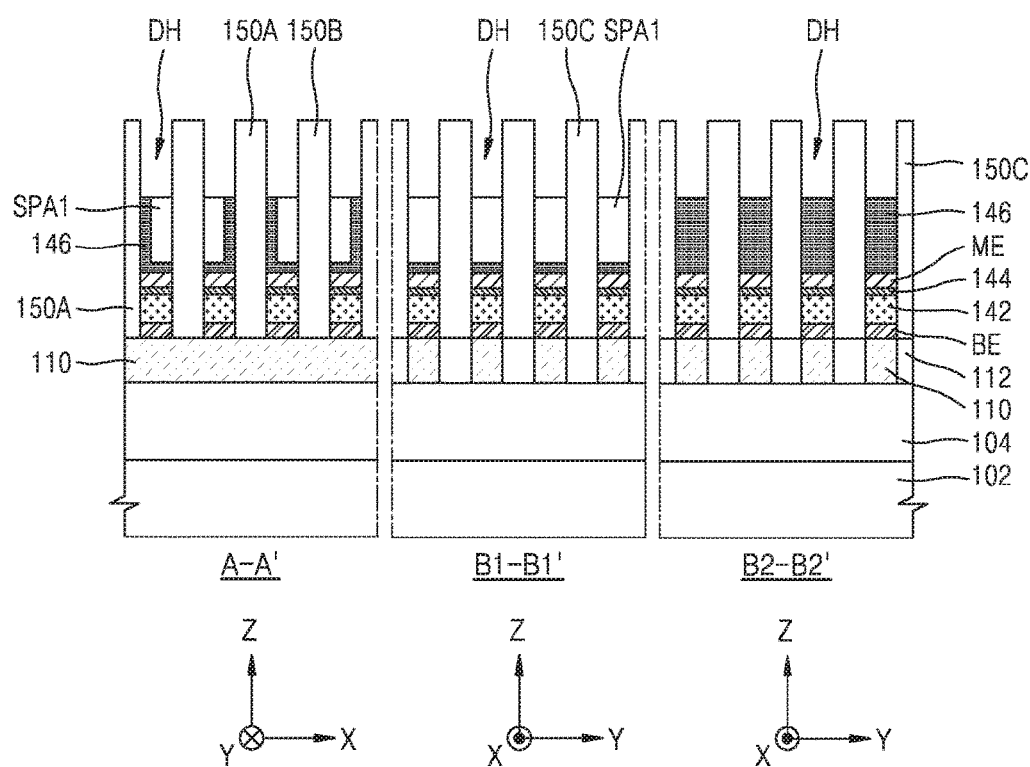
Figure 13P:
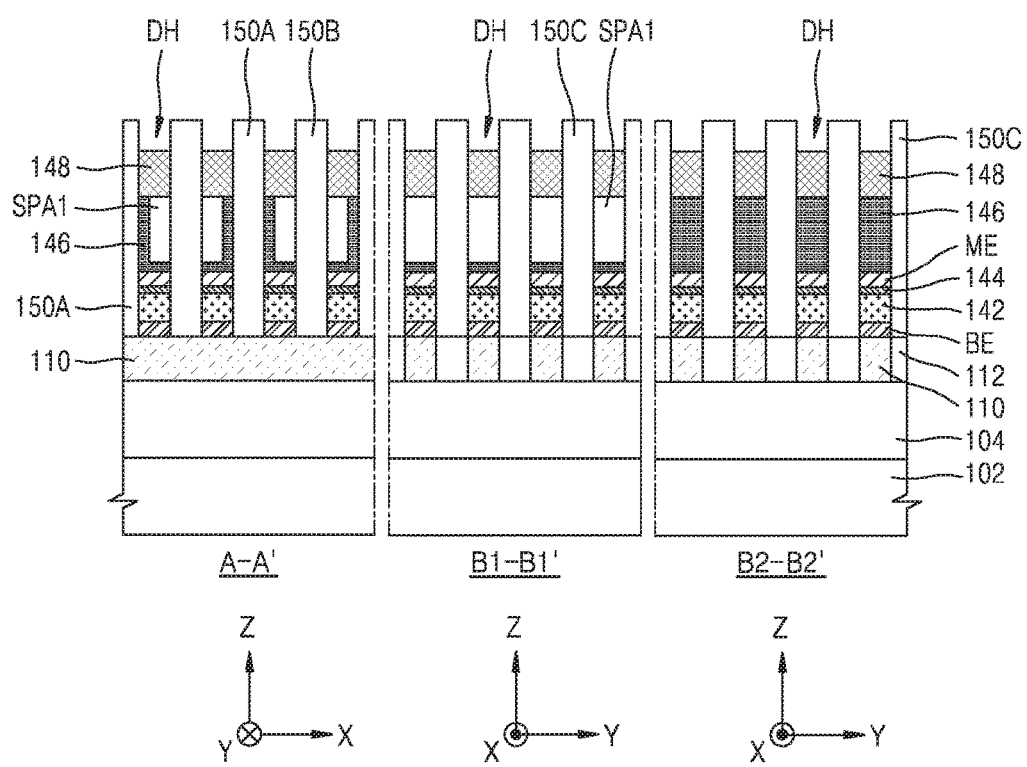
Figure 13Q:
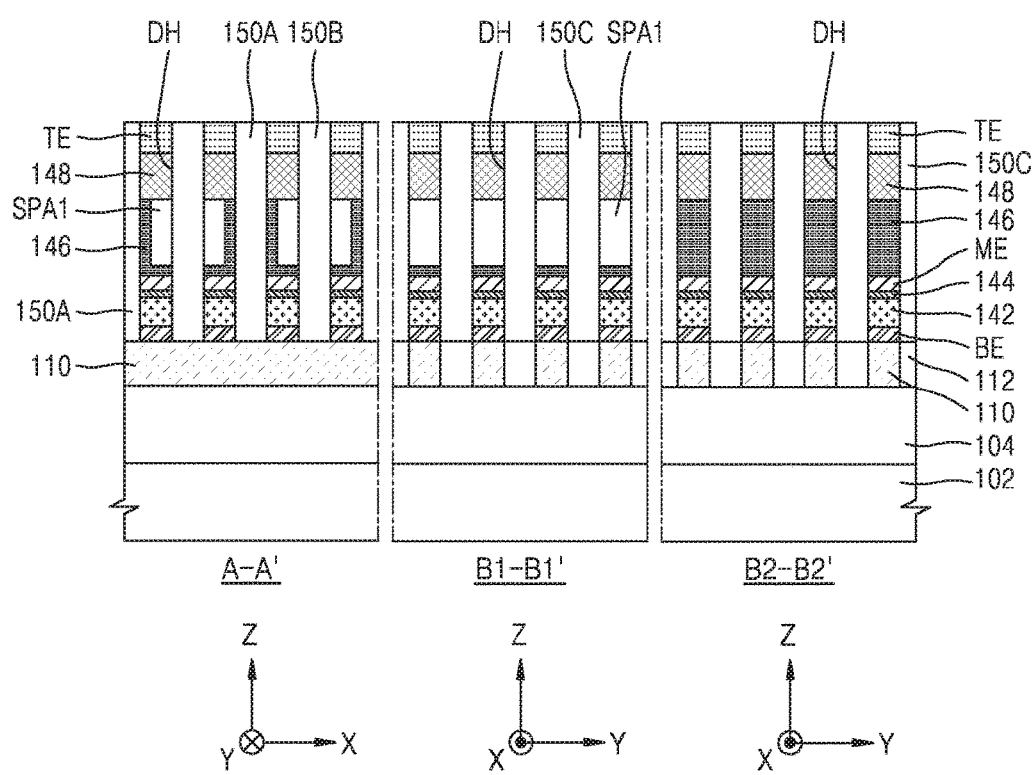
Figure 13R:
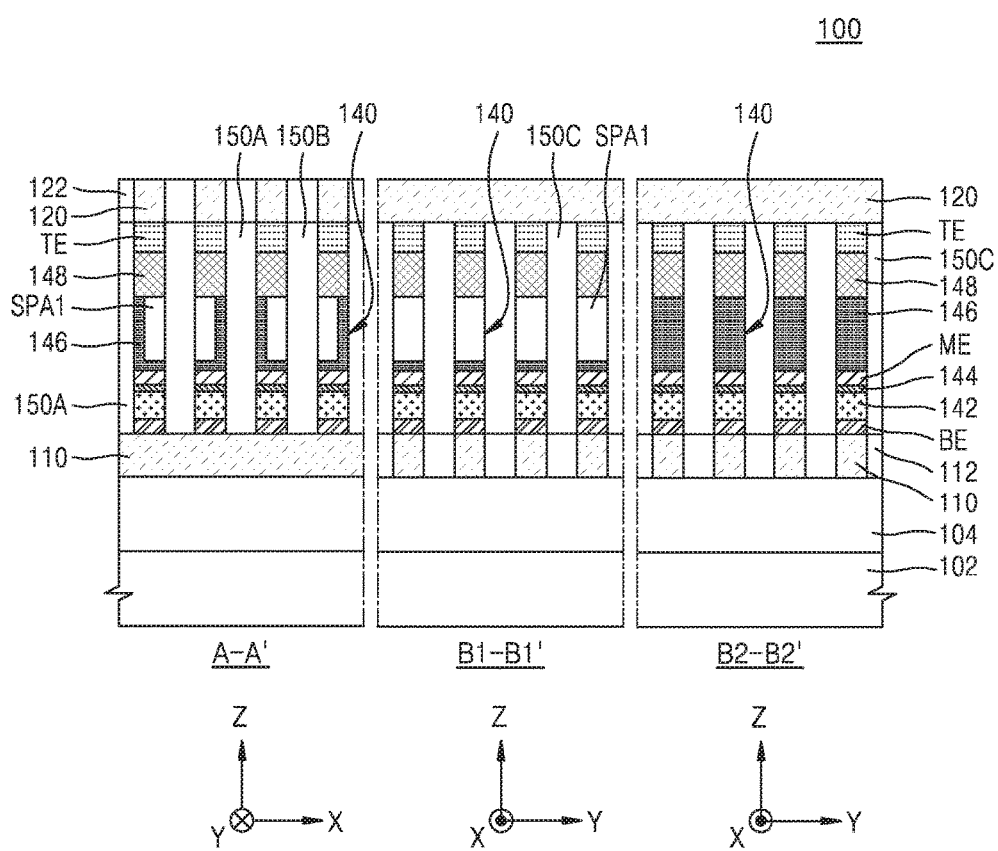

FIGS. 13A to 13R are cross-sectional views illustrating sequential processes of an exemplary method of fabricating a memory device, according to the inventive concept. The method will be described with respect to the fabricating of a memory device of the type shown in FIGS. 3A and 3B. As in FIG. 3B, FIGS. 13A to 13R are cross-sectional views of main components, which correspond to cross sections respectively taken along lines A-A', B1-B1', and B2-B2' of FIG. 3A. In FIGS. 13A to 13R, the same reference numerals as in FIGS. 3A and 3B denote the same members, and descriptions thereof will be omitted.

Referring to FIG. 13A, the interlayer dielectric 104 is formed on the substrate 102, and the plurality of first conductive lines 110 and the plurality of first insulating patterns 112 are formed on the interlayer dielectric 104, the plurality of first insulating patterns 112 insulating the first conductive lines 110 from each other.

Referring to FIG. 13B, a preliminary bottom electrode layer PBE, a preliminary selection device layer P142, a preliminary interfacial layer P144, and a preliminary intermediate electrode layer PME are formed on the plurality of first conductive lines 110 and the plurality of first insulating patterns 112 in this stated order, and a protective insulating film 172 and a first mask pattern 174 are formed on the preliminary intermediate electrode layer PME.

The first mask pattern 174 may include a plurality of line patterns, which each have a first width W1 in the first direction (X direction) and are separated from each other by a first gap G1. In examples of the inventive concept, the first width W1 may be equal in size to the first gap G1, without being limited thereto.

The preliminary bottom electrode layer PBE, the preliminary selection device layer P142, the preliminary interfacial layer P144, and the preliminary intermediate electrode layer PME may respectively include materials constituting the bottom electrode layer BE, the selection device layer 142, the interfacial layer 144, and the intermediate electrode layer ME, which are shown in FIGS. 3A and 3B.

In examples of the inventive concept, the protective insulating film 172 and the first mask pattern 174 may include different material films selected from among an oxide film, a nitride film, a polysilicon film, and a carbon-containing film. For example, the protective insulating film 172 may include a silicon nitride film, and the first mask pattern 174 may include a silicon oxide film.

Although not shown, an additional preliminary interfacial layer may be formed so as to be interposed between the plurality of first conductive lines 110 and the plurality of first insulating patterns 112 and the preliminary bottom electrode layer PBE, and/or between the preliminary bottom electrode layer PBE and the preliminary selection device layer P142. The additional preliminary interfacial layer may be of the same material as the preliminary interfacial layer P144.

Referring to FIG. 13C, a spacer layer 176 is formed and conformally covers exposed surfaces of the protective insulating film 172 and the first mask pattern 174. The spacer layer 176 may include a material that is the same as or has similar etching properties to a material of the first mask pattern 174. For example, the spacer layer 176 may include a silicon oxide film.

Referring to FIG. 13D, a plurality of spacers 176A are formed by performing an etch-back of the spacer layer 176, the plurality of spacers 176A covering both side surfaces of the first mask pattern 174. The protective insulating film 172 may be exposed by the plurality of spacers 176A.

Referring to FIG. 13E, the protective insulating film 172, the preliminary intermediate electrode layer PME, the preliminary interfacial layer P144, the preliminary selection device layer P142, and the preliminary bottom electrode layer PBE are etched by using the first mask pattern 174 and the plurality of spacers 176A as an etch mask, thereby forming a plurality of first line spaces LS1, which expose the plurality of first conductive lines 110 and the plurality of first insulating patterns 112.

The plurality of first line spaces LS1 may extend through the protective insulating film 172, the preliminary intermediate electrode layer PME, the preliminary interfacial layer P144, the preliminary selection device layer P142, and the preliminary bottom electrode layer PBE. The plurality of first line spaces LS1 may each have a second width G2 that is less than the first gap G1 (see FIG. 13B) in the first direction (X direction).

In the process of etching the preliminary intermediate electrode layer PME by using the first mask pattern 174 and the plurality of spacers 176A as an etch mask, the preliminary interfacial layer P144 may serve as an etch stop layer. During the etching of the preliminary intermediate electrode layer PME, the preliminary selection device layer P142 is covered with the preliminary interfacial layer P144 and thus may not be exposed outside thereof. Thus, during the etching of the preliminary intermediate electrode layer PME, the preliminary interfacial layer P144 may protect the preliminary selection device layer P142 from being contaminated with metals derived from the preliminary intermediate electrode layer PME.

Referring to FIG. 13F, the first insulating walls 150A are formed on the resultant product illustrated by FIG. 13E. The plurality of first insulating walls 150A fills the plurality of first line spaces LS1.

Each of the plurality of first insulating walls 150A may have a line shape extending in the second direction (Y direction) through the preliminary intermediate electrode layer PME, the preliminary interfacial layer P144, the preliminary selection device layer P142, and the preliminary bottom electrode layer PBE. The plurality of first insulating walls 150A may have planarized top surfaces extending at the same level as a top surface of the first mask pattern 174.

In examples of the inventive concept, the plurality of first insulating walls 150A may include a material that is the same as or has similar etching properties to a material of the protective insulating film 172. For example, the plurality of first insulating walls 150A may include a silicon nitride film.

Referring to FIG. 13G, the protective insulating film 172 is exposed by the plurality of first insulating walls 150A by removing the first mask pattern 174 and the plurality of spacers 176A, followed by exposing the preliminary bottom electrode layer PBE by removing the protective insulating film 172. During the removing of the protective insulating film 172, heights of the plurality of first insulating walls 150A may be reduced. Each of the plurality of first insulating walls 150A may include a protrusion protruding upwards from the preliminary intermediate electrode layer PME.

Referring to FIG. 13H, a preliminary heating electrode layer P146 and a preliminary first insulating spacer PSPA1 are formed and cover exposed surfaces of the preliminary intermediate electrode layer PME and exposed surfaces of the plurality of first insulating walls 150A.

Each of the preliminary heating electrode layer P146 and the preliminary first insulating spacer PSPA1 may be formed in a liner shape conformally covering the exposed surfaces of the preliminary intermediate electrode layer PME and the exposed surfaces of the plurality of first insulating walls 150A. After the preliminary first insulating spacer PSPA1 is formed, each recess RS may be formed over a top surface of the preliminary first insulating spacer PSPA1 between two of the plurality of first insulating walls 150A. The preliminary heating electrode layer P146 and the preliminary first insulating spacer PSPA1 may respectively include materials constituting the heating electrode layer 146 and the first insulating spacer SPA1, which are shown in FIGS. 3A and 3B.

Referring to FIG. 13I, the preliminary first insulating spacer PSPA1 and the preliminary heating electrode layer P146 undergo etch-back, thereby leaving only portions of the preliminary heating electrode layer P146 and the preliminary first insulating spacer PSPA1, which are self-aligned with and cover both side surfaces of the respective first insulating walls 150A.

Referring to FIG. 13J, the preliminary intermediate electrode layer PME, the preliminary interfacial layer P144, preliminary selection device layer P142, and the preliminary bottom electrode layer PBE are etched by using the plurality of first insulating walls 150A, the preliminary first insulating spacer PSPA1, and the preliminary heating electrode layer P146 as an etch mask, thereby forming a plurality of second line spaces LS2, which expose the plurality of first conductive lines 110 and the plurality of first insulating patterns 112 as open to the recesses RS.

The plurality of second line spaces LS2 may extend through the preliminary intermediate electrode layer PME, the preliminary interfacial layer P144, the preliminary selection device layer P142, and the preliminary bottom electrode layer PBE. The second line spaces LS2 may each have a third width G3 in the first direction (X direction). The third width G3 may be approximately equal to the second width G2 (see FIG. 13E).

In the process of etching the preliminary intermediate electrode layer PME by using the plurality of first insulating walls 150A, the preliminary first insulating spacer PSPA1, and the preliminary heating electrode layer P146 as an etch mask, the preliminary interfacial layer P144 may serve as an etch stop layer. During the etching of the preliminary intermediate electrode layer PME, the preliminary selection device layer P142 is covered with the preliminary interfacial layer P144 and thus may not be exposed. Thus, during the etching of the preliminary intermediate electrode layer PME, the preliminary interfacial layer P144 may protect the preliminary selection device layer P142 from being contaminated with metals derived from the preliminary intermediate electrode layer PME.

Referring to FIG. 13K, the plurality of second insulating walls 150B are formed on the resultant product illustrated by FIG. 13J and fill the plurality of second line spaces LS2 and the plurality of recesses RS.

The plurality of second insulating walls 150B may extend parallel to the plurality of first insulating walls 150A and have planarized top surfaces extending at the same level as the top surfaces of the plurality of first insulating walls 150A. The second insulating walls 150B and the first insulating walls 150A may be alternately arranged along the first direction (X direction). In examples of the inventive concept, the plurality of second insulating walls 150B may include the same material as the plurality of first insulating walls 150A. For example, the plurality of second insulating walls 150B may include a silicon nitride film.

Referring to FIG. 13L, a second mask pattern 180 is formed on the preliminary heating electrode layer P146, the preliminary first insulating spacer PSPA1, the plurality of first insulating walls 150A, and the plurality of second insulating walls 150B. The second mask pattern 180 may include a plurality of line patterns extending in the first direction (X direction). The second mask pattern 180 may include a material that is the same as or has similar etching properties to materials of the plurality of first insulating walls 150A and the plurality of second insulating walls 150B. For example, the second mask pattern 180 may include a silicon nitride film.

Referring to FIG. 13M, the preliminary first insulating spacer PSPA1, the preliminary intermediate electrode layer PME, the preliminary interfacial layer P144, the preliminary selection device layer P142, and the preliminary bottom electrode layer PBE are etched by using the second mask pattern 180 as an etch mask, thereby forming a plurality of stack structures each including the bottom electrode layer BE, the selection device layer 142, the interfacial layer 144, and the intermediate electrode layer ME. A plurality of holes HS are defined between the stack structures and expose the plurality of first insulating patterns 112.

In the process of etching the preliminary intermediate electrode layer PME by using the second mask pattern 180 as an etch mask, the preliminary interfacial layer P144 may serve as an etch stop layer. During the etching of the preliminary intermediate electrode layer PME, the preliminary selection device layer P142 is covered with the preliminary interfacial layer P144 and thus may not be exposed. Thus, during the etching of the preliminary intermediate electrode layer PME, the preliminary interfacial layer P144 may protect the preliminary selection device layer P142 from being contaminated with metals derived from the preliminary intermediate electrode layer PME.

Referring to FIG. 13N, a filling insulating film is formed to a thickness great enough to fill the plurality of holes HS in the resultant product illustrated by FIG. 13M, followed by planarizing the resultant product illustrated by FIG. 13M such that a top portion of the filling insulating film and the second mask pattern 180 are removed, thereby leaving a plurality of first to third insulating walls 150A, 150B, and 150C, which have planarized top surfaces. During the planarizing of the resultant product illustrated by FIG. 13M, heights of the preliminary heating electrode layer P146 and the preliminary first insulating spacer PSPA1 may be reduced. A plurality of third insulating walls 150C remain in the plurality of holes HS, the plurality of third insulating walls 150C being portions of the filling insulating film. The plurality of first to third insulating walls 150A, 150B, and 150C, a plurality of preliminary heating electrode layers P146, and a plurality of preliminary first insulating spacers PSPA1 may have top surfaces at an approximately equal level.

Referring to FIG. 13O, in the resultant product illustrated by FIG. 13N, the plurality of preliminary heating electrode layers P146 and the plurality of preliminary first insulating spacers PSPA1 are removed, beginning at exposed surfaces thereof, up to a certain thickness by using the etch selectivity of preliminary heating electrode layers P146 and the plurality of preliminary first insulating spacers PSPA1 with respect to the plurality of first to third insulating walls 150A, 150B, and 150C, thereby forming a plurality of heating electrode layers 146 and a plurality of first insulating spacers SPA1 simultaneously with forming a plurality of damascene holes DH, which expose the plurality of heating electrode layers 146 and the plurality of first insulating spacers SPA1. The (first-direction (X direction) widths and second-direction (Y direction) widths of the plurality of) damascene holes DH may be defined by the first to third insulating walls 150A, 150B, and 150C.

In examples of the inventive concept, a wet etching process may be used to remove certain thicknesses of the plurality of preliminary heating electrode layers P146 and the plurality of preliminary first insulating spacers PSPA1. For example, when the preliminary heating electrode layers P146 include TiSiN, an etching solution such as SPM (sulfuric peroxide mixture), SC1 (mixture of $NH_4OH$, $H_2O_2$, and $H_2O$), or $H_2O_2$ may be used to remove portions of the plurality of preliminary heating electrode layers P146. When the plurality of preliminary first insulating spacers PSPA1 is constituted by a silicon oxide film, an HF etching solution may be used to remove portions of the plurality of preliminary first insulating spacers PSPA1. However, the inventive concept is not limited thereto; rather, certain thicknesses of the plurality of preliminary heating electrode layers P146 and the plurality of preliminary first insulating spacers PSPA1 may be removed by various wet etching processes, various dry etching processes, or combinations thereof, which may individually or collectively be referred to as "an etch process" or simply as "etching".

In the method of fabricating the memory device 100 according to the inventive concept, to form the plurality of heating electrode layers 146, a self-alignment using side surfaces of the plurality of first insulating walls 150A is employed, as described with reference to FIGS. 13H to 13O. Thus, even though components like the plurality of heating electrode layers 146 constituting the memory device 100 are scaled down to meet the demand for high integration, the components may be formed at relatively low costs by a simplified process, and a structure in which the plurality of heating electrode layers 146 have small critical dimensions (CDs) to provide desired heating efficiency may be easily obtained.

Referring to FIG. 13P, resistive memory layers 148 are formed and respectively partially fill the damascene holes DH.

To form the plurality of resistive memory layers 148, a damascene process may be used. For example, a resistive material layer thick enough to fill the plurality of damascene holes DH may be formed, followed by performing etch-back of the resistive material layer, thereby leaving the plurality of resistive memory layers 148 only in lower partial spaces in the plurality of damascene holes DH. After the resistive memory layers 148 are formed, upper partial spaces in the plurality of damascene holes DH may remain.

Because the resistive memory layers 148 are formed by the damascene process, there is no concern that side surfaces of each of the plurality of resistive memory layers 148 are damaged by an etching process during the process of forming the plurality of resistive memory layers 148. Thus, the deterioration of the plurality of resistive memory layers 148 may be prevented.

Referring to FIG. 13Q, top electrode layers TE are formed, the plurality of top electrode layers TE filling the upper partial spaces in the plurality of damascene holes DH and covering the plurality of resistive memory layers 148.

To form the plurality of top electrode layers TE, a damascene process may be used. For example, a conductive material layer thick enough to fill the plurality of damascene holes DH may be formed on the plurality of resistive memory layers 148, followed by performing etch-back of the conductive material layer, thereby leaving the plurality of top electrode layers TE only in the upper partial spaces of the plurality of damascene holes DH. The top electrode layers TE may have top surfaces that are at an approximately equal level to top surfaces of the first to third insulating walls 150A, 150B, and 150C.

Referring to FIG. 13R, the plurality of second conductive lines 120 and the plurality of second insulating patterns 122 may be formed on the resultant product including the plurality of top electrode layers TE, thereby completing the forming of the memory device 100.

According to the method of fabricating the memory device 100, which has been described with reference to FIGS. 13A to 13R, to form the plurality of memory cell pillars 140 constituting the plurality of memory cells MC, a process of performing self-alignment using the side surfaces of the plurality of first insulating walls 150A is employed. Thus, the memory cell pillars 140 having fine CDs may be formed at relatively low costs by a simplified process to meet the demand for high integration without sacrificing reliability or incurring excessive manufacturing costs.

Heretofore, although the method of fabricating the memory device 100 shown in FIGS. 3A and 3B has been described with reference to FIGS. 13A to 13R, the memory devices 200, 300, 400, 500, 600, 700, 800, and 900 shown in FIGS. 5 to 12B or memory devices having various structures similar thereto may be fabricated by using the processes described with reference to FIGS. 13A to 13R or using various methods modified and changed therefrom without departing from the spirit and scope of the inventive concept.

To fabricate the memory devices 200 and 300 shown in FIGS. 5 and 6, in the process of forming the plurality of damascene holes DH by partially removing the plurality of preliminary heating electrode layers P146 and the plurality of preliminary first insulating spacers PSPA1 as described with reference to FIG. 13O, necessary amounts of the plurality of preliminary heating electrode layers P146 and of the plurality of preliminary first insulating spacers PSPA1 may be etched away, thereby forming the damascene holes DH having desired cross-sectional shapes. After that, the processes described with reference to FIGS. 13P to 13R may be performed.

To fabricate the memory device 400 shown in FIG. 7, the plurality of damascene holes DH may be formed as described with reference to FIG. 13O, followed by removing upper portions of the plurality of first to third insulating walls 150A, 150B, and 150C, which define side surfaces of the plurality of damascene holes DH, thereby forming the plurality of damascene holes DH having inclined inner side surfaces along the second straight line L2 shown in FIG. 7. After that, the resistive memory layer 448 and the top electrode layer TE4, which have inclined side surfaces, may be formed in each of the plurality of damascene holes DH.

To fabricate the memory device 500 shown in FIG. 8, the plurality of damascene holes DH may be formed as described with reference to FIG. 13O, followed by removing the upper portions of the plurality of first to third insulating walls 150A, 150B, and 150C, which define the side surfaces of the plurality of damascene holes DH, by using a wet etching process, thereby forming the first insulating wall 550A including the recessed side surface AS2 and the second insulating wall 550B including the recessed side surface AS4. After that, the second insulating spacer SPB may be formed and cover the recessed side surfaces AS2 and AS4 in each of the plurality of damascene holes DH, and the resistive memory layer 148 and the top electrode layer TE5 may be formed in each of the plurality of damascene holes DH by a similar method to the method described with reference to FIGS. 13P and 13Q.

To fabricate the memory device 600 shown in FIG. 9, in the process described with reference to FIG. 13M, when the plurality of stack structures each including the bottom electrode layer BE, the selection device layer 142, the interfacial layer 144, and the intermediate electrode layer ME are formed by etching the preliminary first insulating spacer PSPA1, the preliminary intermediate electrode layer PME, the preliminary interfacial layer P144, the preliminary selection device layer P142, and the preliminary bottom electrode layer PBE by using the second mask pattern 180 as an etch mask, the plurality of holes HS may be formed such that each of the holes HS has a decreasing width in the second direction (Y direction) with decreasing distance from the substrate 102. After that, the filling insulating film is formed in the plurality of holes HS by a method similar to the method described with reference to FIG. 3N, followed by planarizing the resultant product illustrated by FIG. 13M such that the top portion of the filling insulating film and the second mask pattern 180 are removed, thereby forming the plurality of memory cell pillars 640 having inclined side surfaces and the third insulating walls 650C having inclined side surfaces, as shown in FIG. 9.

Although the inventive concept has been particularly shown and described with reference to example of the inventive concept thereof, it will be understood that various changes in form and details may be made thereto without departing from the spirit and scope of the inventive concept as defined by the following claims.

What is claimed is:

1. A method of fabricating a memory device, the method comprising:
    forming a stack structure over a substrate, the stack structure comprising a preliminary selection device layer and a preliminary electrode layer;
    forming a plurality of first line spaces extending through the stack structure;
    forming a plurality of first insulating walls in the plurality of first line spaces, the plurality of first insulating walls including protrusions each protruding upwards from the stack structure;
    forming a plurality of preliminary heating electrode layers, which cover side surfaces of the protrusions of the plurality of first insulating walls;
    forming a plurality of second line spaces, each of the plurality of second line spaces being situated between two of the plurality of the first insulating walls, and the plurality of second line spaces extending through the stack structure;
    forming a plurality of second insulating walls in the plurality of second line spaces, the plurality of second insulating walls extending parallel to the plurality of first insulating walls;
    forming a plurality of holes by removing portions of the plurality of preliminary heating electrode layers and the stack structure which extend along a direction intersecting the plurality of first insulating walls, the holes exposing portions of the preliminary selection device layer and thereby forming a plurality of selection device layers, and the holes exposing portions of the preliminary electrode layer and thereby forming a plurality of electrode layers; and
    forming a plurality of third insulating walls in the plurality of holes, the plurality of third insulating walls covering side surfaces of the plurality of selection device layers and side surfaces of the plurality of electrode layers.

2. The method according to claim 1, wherein the forming of the stack structure comprises forming a preliminary bottom electrode layer, the preliminary selection device layer, and a preliminary intermediate electrode layer on the substrate one over another in this stated order.

3. The method according to claim 1, wherein the forming of the stack structure comprises forming a preliminary bottom electrode layer, the preliminary selection device layer, a preliminary interfacial layer, and a preliminary intermediate electrode layer on the substrate one over another in this stated order.

4. The method according to claim 3, wherein the preliminary selection device layer comprises a material having Ovonic threshold switching properties.

5. The method according to claim 3, wherein the preliminary interfacial layer comprises a nonmetallic material.

6. The method according to claim 1, wherein the forming of the plurality of first line spaces comprises:
    forming a first mask pattern on the stack structure, the first mask pattern comprising a plurality of line patterns;
    forming a plurality of spacers, which cover side surfaces of the plurality of line patterns; and
    etching the stack structure by using the first mask pattern and the plurality of spacers as an etch mask.

7. The method according to claim 6, wherein the forming of the stack structure comprises forming a preliminary bottom electrode layer, the preliminary selection device layer, a preliminary interfacial layer, and a preliminary intermediate electrode layer on the substrate one over another in this stated order, and
    the etching of the stack structure comprises etching the preliminary intermediate electrode layer while using the preliminary interfacial layer as an etch stop layer.

8. The method according to claim 1, wherein the forming of the plurality of preliminary heating electrode layers comprises:
    forming a first liner for forming a heating electrode, the first liner conformally covering the protrusions of the plurality of first insulating walls and the stack structure;
    forming a second liner on the first liner, the second liner comprising an insulating film conformally covering the first liner; and
    forming the plurality of preliminary heating electrode layers and a plurality of insulating spacers by performing an etch-back of the first liner and the second liner, the plurality of preliminary heating electrode layers and the plurality of insulating spacers facing respective ones of the side surfaces of the plurality of first insulating walls.

9. The method according to claim 8, wherein the forming of the plurality of second line spaces comprises etching the stack structure using the plurality of preliminary heating electrode layers and the plurality of insulating spacers as an etch mask.

10. The method according to claim 1, after the forming of the plurality of third insulating walls, further comprising:
forming a plurality of holes by removing portions of the plurality of preliminary heating electrode layers from the stack structure, the plurality of holes delimited by the plurality of first insulating walls, the plurality of second insulating walls, and the plurality of third insulating walls; and
forming a plurality of resistive memory layers in the plurality of holes by a damascene process, the plurality of resistive memory layers contacting the plurality of preliminary heating electrode layers.

11. A method of fabricating a memory device, the method comprising:
forming a preliminary bottom electrode layer, a preliminary selection device layer, and a preliminary intermediate electrode layer on a substrate one over another in this stated order;
forming a plurality of first line spaces that extend through the preliminary intermediate electrode layer, the preliminary selection device layer, and the preliminary bottom electrode layer;
forming a plurality of first insulating walls in the plurality of first line spaces, the plurality of first insulating walls including protrusions each protruding upwards from the preliminary intermediate electrode layer;
forming a plurality of preliminary heating electrode layers and a plurality of preliminary first insulating spacers on the preliminary intermediate electrode layer, the plurality of preliminary heating electrode layers and the plurality of preliminary first insulating spacers covering side surfaces of the plurality of first insulating walls;
forming a plurality of second line spaces each between two of the plurality of first insulating walls, the plurality of second line spaces extending through the preliminary intermediate electrode layer, the preliminary selection device layer, and the preliminary bottom electrode layer;
forming a plurality of second insulating walls in the plurality of second line spaces, the plurality of second insulating walls extending parallel to the plurality of first insulating walls;
forming a plurality of holes by partially removing portions of the plurality of preliminary heating electrode layers, the plurality of preliminary first insulating spacers, the preliminary intermediate electrode layer, the preliminary selection device layer, and the preliminary bottom electrode layer which extend along a direction intersecting the plurality of first insulating walls; and
forming a plurality of third insulating walls in the plurality of holes.

12. The method according to claim 11, after the forming of the plurality of third insulating walls, further comprising:
forming heating electrode layers each having an L-shaped cross section and first insulating spacers on parts of the heating electrode layers, respectively, by removing portions of the plurality of preliminary heating electrode layers and the plurality of preliminary first insulating spacers; and
forming resistive memory layers on the first insulating spacers, respectively, using a damascene process, the resistive memory layers contacting the heating electrode layers, respectively.

13. The method according to claim 12, wherein top surfaces of the heating electrode layers and top surfaces of the first insulating spacer are coplanar.

14. The method according to claim 12, wherein top surfaces of the heating electrode layer are situated at a different level in the device from top surfaces of the first insulating spacers.

15. A method of fabricating a memory device, the method comprising:
forming a set of parallel first conductive lines on a substrate, each of the first conductive lines extending lengthwise in a first direction parallel to an upper surface of the substrate;
forming an array of memory cell pillars, each of the memory cell pillars extending upright on a respective one of the first conductive lines in a direction perpendicular to the upper surface of the substrate; and
forming a set of parallel second conductive lines, each of the second conductive lines extending lengthwise in a second direction parallel to the upper surface of the substrate and crossing over a plurality of the first conductive lines and each of the memory cell pillars extending upright on the first conductive lines, such that the memory cell pillars are located at points at which the second conductive lines and the first conductive lines cross as seen in a plan view of the first and second conductive lines and memory cell pillars,
wherein the forming of the array of memory cell pillars forms resistive memory elements each having a state of resistance that can be changed and that stores information corresponding to the state of resistance, selection devices that serve to allow the resistive memory elements to be selectively accessed, heating electrodes each having an L-shaped cross section in a vertical plane so as to each have a leg and an ascender, and first insulating layer spacers each disposed on the leg of a respective one of the heating electrodes, and
the forming of the array of memory cell pillars includes forming a preliminary bottom electrode layer on the first conductive lines,
forming a preliminary selection device layer on the preliminary bottom electrode layer,
forming first linear spaces through the preliminary selection device layer and the preliminary bottom electrode layer, the first linear spaces each extending longitudinally in a direction parallel to the upper surface of the substrate,
forming first walls of insulating material in the first line spaces, respectively, each of the first walls protruding upwards from the preliminary selection device layer,
conformally forming a preliminary heating electrode layer on the first walls,
conformally forming a preliminary insulating layer on the preliminary heating electrode layer,
removing portions of the preliminary insulating layer and portions of the preliminary heating electrode layer that are located intermediate the first walls to form the heating electrodes as each self-aligned with opposite sides of a respective one of the selection devices of the memory cell pillars, and forming the resistive memory elements each directly on both the ascender of a respective one of the heating electrodes and a respective one of the first insulating layer spacers of the memory cell pillars as self-aligned with a structure constituted by the respective one of the heating electrodes and the respective one of the first insulating layer spacers.

16. The method according to claim 15, wherein the forming of the array of memory cell pillars includes:
removing portions of the preliminary insulating layer, portions of the preliminary heating electrode layer, portions of the preliminary bottom electrode layer and portions of the preliminary selection device layer, to thereby form second linear spaces each extending longitudinally in a direction parallel to the upper surface of the substrate, and
filling the second linear spaces with insulating material to form second walls of insulating material extending parallel to the first walls, each of the second walls being interposed between two adjacent ones of the first walls.

17. The method according to claim 16, wherein the removing of portions of the preliminary insulating layer forms preliminary insulating layer spacers, and the removing of the portions of the preliminary heating electrode layer forms preliminary heating electrodes, and
the forming of the array of memory cell pillars includes:
forming a plurality of holes extending vertically through the preliminary insulating layers spacers, the preliminary heating electrodes, the preliminary selection device layer and the preliminary bottom electrode layer, and
filling the holes with insulating material.

18. The method according to claim 17, wherein the forming of the array of memory cell pillars includes:
etching back the preliminary insulating layers spacers and the preliminary heating electrodes to form damascene holes,
providing variable resistive memory material, constituting the resistive memory elements, within the holes.

19. The method according to claim 18, wherein the variable resistive memory material comprises germanium, antimony and tellurium.

* * * * *